US011232947B1

(12) United States Patent
Chu et al.

(10) Patent No.: US 11,232,947 B1
(45) Date of Patent: Jan. 25, 2022

(54) AMMONIUM FLUORIDE PRE-CLEAN PROTECTION

(71) Applicant: Taiwan Semiconductor Manufacturing Company Limited, Hsinchu (TW)

(72) Inventors: Li-Wei Chu, New Taipei (TW); Ying-Chi Su, Hsinchu (TW); Yu-Kai Chen, Taipei (TW); Wei-Yip Loh, Hsinchu (SG); Hung-Hsu Chen, Tainan (TW); Chih-Wei Chang, Hsin-Chu (TW); Ming-Hsing Tsai, Chu-Pei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/009,103

(22) Filed: Sep. 1, 2020

(51) Int. Cl.
*H01L 21/02* (2006.01)
*H01L 21/56* (2006.01)
*H01L 29/40* (2006.01)
*H01L 29/417* (2006.01)

(52) U.S. Cl.
CPC .... *H01L 21/02334* (2013.01); *H01L 21/0206* (2013.01); *H01L 21/02046* (2013.01); *H01L 21/02068* (2013.01); *H01L 21/56* (2013.01); *H01L 29/401* (2013.01); *H01L 29/41783* (2013.01)

(58) Field of Classification Search
CPC ......... H01L 21/02334; H01L 21/02046; H01L 21/02068; H01L 21/0206; H01L 21/56
See application file for complete search history.

(56) References Cited

U.S. PATENT DOCUMENTS

| | | | | | |
|---|---|---|---|---|---|
| 6,165,880 | A | * | 12/2000 | Yaung | H01L 21/28525 257/E21.166 |
| 6,319,784 | B1 | * | 11/2001 | Yu | H01L 21/28518 257/E21.165 |
| 2005/0106888 | A1 | * | 5/2005 | Chiu | H01L 21/02063 438/710 |
| 2007/0123051 | A1 | * | 5/2007 | Arghavani | H01L 21/31116 438/715 |
| 2009/0004850 | A1 | * | 1/2009 | Ganguli | H01L 21/68785 438/655 |
| 2009/0191703 | A1 | * | 7/2009 | Lu | H01L 21/28518 438/637 |
| 2010/0129982 | A1 | * | 5/2010 | Kao | H01L 21/76232 438/430 |

(Continued)

*Primary Examiner* — Joseph C. Nicely
(74) *Attorney, Agent, or Firm* — Harrity & Harrity, LLP

(57) ABSTRACT

An ammonium fluoride gas may be used to form a protection layer for one or more interlayer dielectric layers, one or more insulating caps, and/or one or more source/drain regions of a semiconductor device during a pre-clean etch process. The protection layer can be formed through an oversupply of nitrogen trifluoride during the pre-clean etch process. The oversupply of nitrogen trifluoride causes an increased formation of ammonium fluoride, which coats the interlayer dielectric layer(s), the insulating cap(s), and/or the source/drain region(s) with a thick protection layer. The protection layer protects the interlayer dielectric layer(s), the insulating cap(s), and/or the source/drain region(s) during the pre-clean process from being etched by fluorine ions formed during the pre-clean process.

20 Claims, 17 Drawing Sheets

(56) References Cited

U.S. PATENT DOCUMENTS

| | | | |
|---|---|---|---|
| 2011/0215421 A1* | 9/2011 | Lee | H01L 29/36 257/402 |
| 2016/0005651 A1* | 1/2016 | Watanabe | H01L 21/31116 438/702 |
| 2016/0126135 A1* | 5/2016 | Zhang | H01L 23/485 257/751 |
| 2016/0133459 A1* | 5/2016 | Ko | H01L 29/66795 438/759 |
| 2016/0133480 A1* | 5/2016 | Ko | H01L 21/76897 438/690 |
| 2017/0294535 A1* | 10/2017 | Zhang | H01L 21/76897 |
| 2018/0082836 A1* | 3/2018 | Yan | H01L 21/02057 |

* cited by examiner

AMMONIUM FLUORIDE PRE-CLEAN PROTECTION

BACKGROUND

As processing nodes for transistors shrink, and as transistor density increases, the available spacing between the gate of a transistor and the source contact and drain contact decreases and/or is eliminated entirely. A self-aligned contact (SAC) process is a process by which a contact for a source/drain region of a transistor is at least partially formed over a metal gate (MG) of the transistor. An insulating cap is formed over the MG to electrically isolate the MG from the contact (the contact may be referred to as a metal drain or a metal on operation domain (MD)). In this way, the SAC process may be used to permit further reductions in processing node sizes, to permit increased transistor densities for semiconductor devices, and/or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
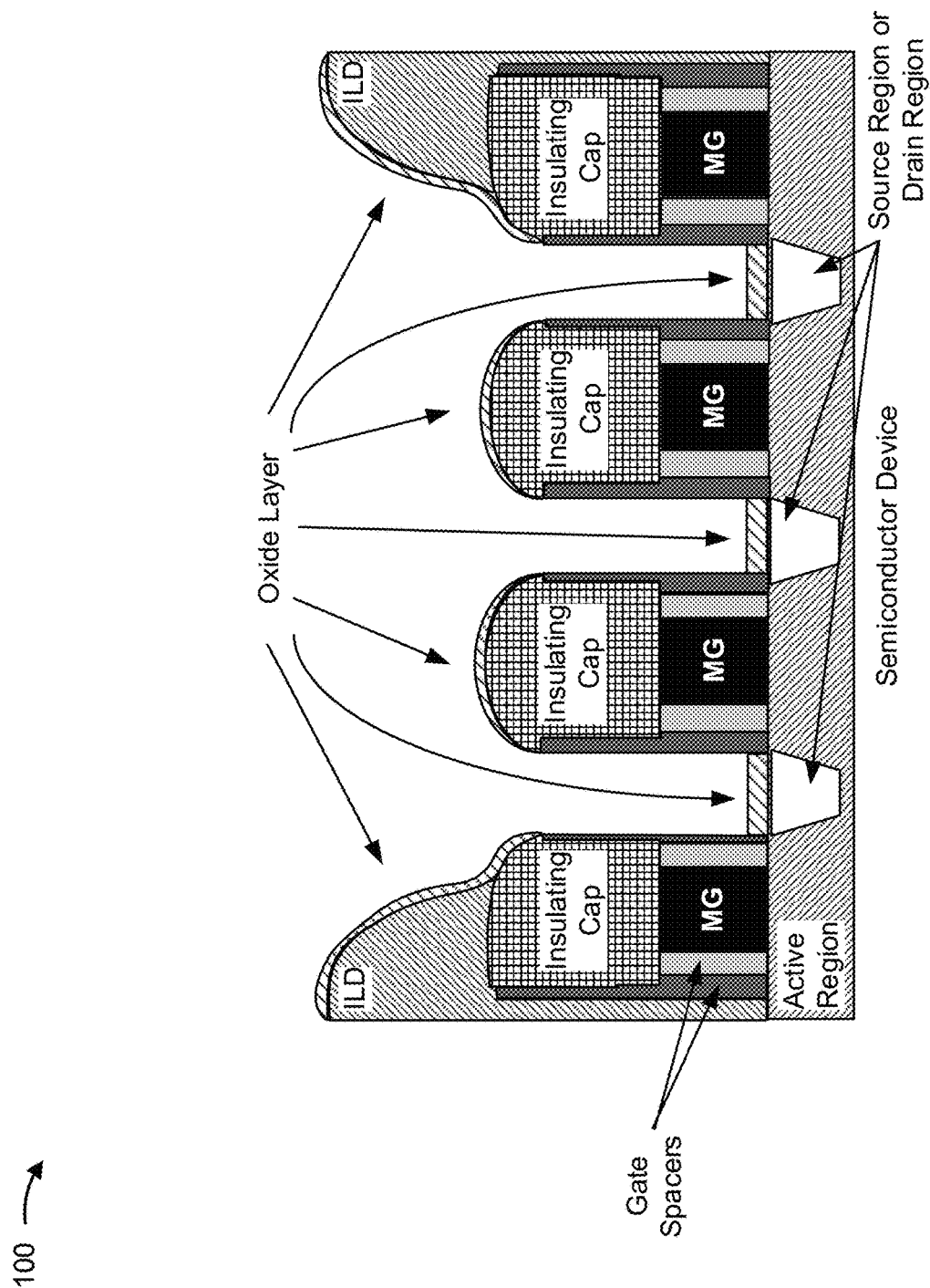
FIGS. 1A-1J are diagrams of one or more example implementations described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a self-aligned contact (SAC) process, an SAC contact may be formed to connect a source region or a drain region of a semiconductor device (e.g., a transistor, a memory device, and/or the like) to a conductive layer. To decrease resistance between the source/drain region and the conductive layer, a metal silicide (e.g., titanium silicide (TiSi) or another type of metal silicide) may be applied to the top surface of the source/drain region prior to formation of the contact. The top surface of the source/drain region may be prepared for the metal silicide using a pre-clean process (e.g., an epitaxial pre-clean process, a silicide pre-clean process, and/or the like) to remove residual oxides and other contaminates. After the pre-clean, a metal layer (e.g., a titanium layer) is formed over the source/drain region, and the wafer is subjected to a high-temperature anneal which causes the metal to react with silicon to form the metal silicide layer.

However, the pre-clean process (as well as various etch processes during formation of the self-aligned contacts) may cause excessive removal of protective interlayer dielectric (ILD) material from the transistor and silicon nitride (SixNy, such as $Si_3N_4$) material from the insulating cap that isolates a metal drain (MD) of the semiconductor device from the SAC contact. This can increase the risk of shorting between the MD and a metal gate (MG) of the semiconductor device, can increase SAC loss loading for the semiconductor device, can decrease an epitaxial loss window for the semiconductor device, and/or the like.

Some implementations described herein provide techniques and apparatuses for using an ammonium fluoride ($NH_4F$) gas to form a protection layer for one or more interlayer dielectric layers, one or more insulating caps, and/or one or more source/drain regions of a semiconductor device during a pre-clean etch process. The protection layer can be formed through an oversupply of nitrogen trifluoride ($NF_3$) during the pre-clean etch process. The oversupply of nitrogen trifluoride may be provided by increasing the flow-in of nitrogen trifluoride relative to a traditional amount of nitrogen trifluoride used during a pre-clean process. The oversupply of nitrogen trifluoride causes an increased formation of an ammonium fluoride gas, which deposits onto the interlayer dielectric layer(s), the insulating cap(s), and the source/drain region(s) as a thick protection layer. The ammonium fluoride in the protection layer cleans an oxide layer from the interlayer dielectric layer(s), the insulating cap(s), and the source/drain region(s) during the pre-clean process by reacting with the oxide layer to form ammonium fluorosilicate. The ammonium fluorosilicate may be decomposed into one or more gasses through heating at the end of or after the pre-clean process, which are then removed from a pre-clean chamber.

In this way, the protection layer protects the interlayer dielectric layer(s), the insulating cap(s), and the source/drain region(s) during the pre-clean process from being etched by fluorine ions formed during the pre-clean process. This may reduce the risk of an MG/MD short, may reduce SAC loss loading for the semiconductor device (e.g., may reduce the amount of insulating layer loss during the pre-clean process), may increase the epitaxial loss window for the semiconductor device (e.g., may increase the temperature window for the pre-clean process, which may protect against temperature drift), and/or the like.

FIGS. 1A-1J are diagrams of one or more example implementations 100 described herein. Example implementation(s) 100 may include one or more example implementations of forming one or more parts of a semiconductor device using an ammonium fluoride protection layer. The semiconductor device may include a transistor (e.g., a metal oxide field effect transistor (MOSFET) or another type of transistor), a memory device (e.g., a static random access memory (SRAM) or another type of memory device), and/or the like.

As shown in FIG. 1A, the semiconductor device may include various structures formed in and/or on a substrate (e.g., a semiconductor wafer), such as an active region, one or more source regions and/or drain regions, one or more metal gates (MGs), one or more gate spacers, one or more insulating caps, one or more interlayer dielectric (ILD) layers, and/or the like. The active region (which, in some cases, may be referred to as an operation domain) may include a material that electrically insulates the metal gate(s) and the source/drain region(s) of the semiconductor device from other portions of the semiconductor device. For example, the active region may include tantalum nitride (TaN), a silicon oxide ($SiO_x$, such as SiO or $SiO_2$), silicate glass, silicon oxycarbide, and/or the like. The interlayer dielectric layer(s) may include an electrically insulating material that electrically insulates the structures from other portions of the semiconductor device. For example, the interlayer dielectric layer(s) may include tantalum nitride (TaN), silicon oxide ($SiO_x$), silicate glass, silicon oxycarbide, a silicon nitride ($Si_xN_y$), and/or the like. In some implementations, the interlayer dielectric layer(s) may be formed to a height of around 80 nanometers or greater. The source/drain region(s) may include a silicon germanium formed via epitaxial growth and, thus, may be referred to as epitaxial regions. In some implementations, the source/drain region(s) each form a source/drain plug that is electrically coupled to one or more other components of the semiconductor device.

The metal gate(s) may include an electrically conductive metal, such as titanium, cobalt, tungsten, aluminum, copper, ruthenium, iridium, and/or the like. The metal gate(s) may be electrically isolated from trenches in which conductors or MDs are to be formed from one or more gate spacers. The gate spacers may include electrically insulating sidewalls formed of an electrically insulating material, such as tantalum nitride (TaN), a silicon oxide ($SiO_x$), silicate glass, silicon oxycarbide, a silicon nitride ($Si_xN_y$), and/or the like.

In some implementations, the semiconductor device may be processed to form one or more SAC contacts (or SAC MD structures) over one or more of the source/drain regions and in trenches between the metal gates. In these examples, a portion of the metal gates may be etched (e.g., using a dry etching process, a wet etching process, and/or the like) such that an insulating cap may be formed over each of the metal gate(s) to electrically insulate the top and/or portions of the side of the metal gates from the SAC conductors. The insulating cap(s) may be formed of an electrically insulating material, such as tantalum nitride (TaN), a silicon oxide ($SiO_x$), silicate glass, silicon oxycarbide, a silicon nitride ($Si_xN_y$), and/or the like. In some implementations, the insulating caps may be formed to an example height of around 30-60 nanometers.

Prior to forming the one or more SAC contacts, a metal silicide layer may be formed in and/or on the source/drain regions to decrease contact resistance between the SAC contacts and the source/drain regions, and to decrease contact resistance between the SAC conductors and a conductive layer that is to be formed above the SAC contacts. An oxide layer may be removed from various portions of the semiconductor device to prepare the source/drain regions for metal silicide formation. The oxide layer may include residual material, such as a silicon oxide, that formed on the various portions of the semiconductor as a result other semiconductor processes. This oxide layer may otherwise cause increased contact resistance if not removed.

Figure 1B:
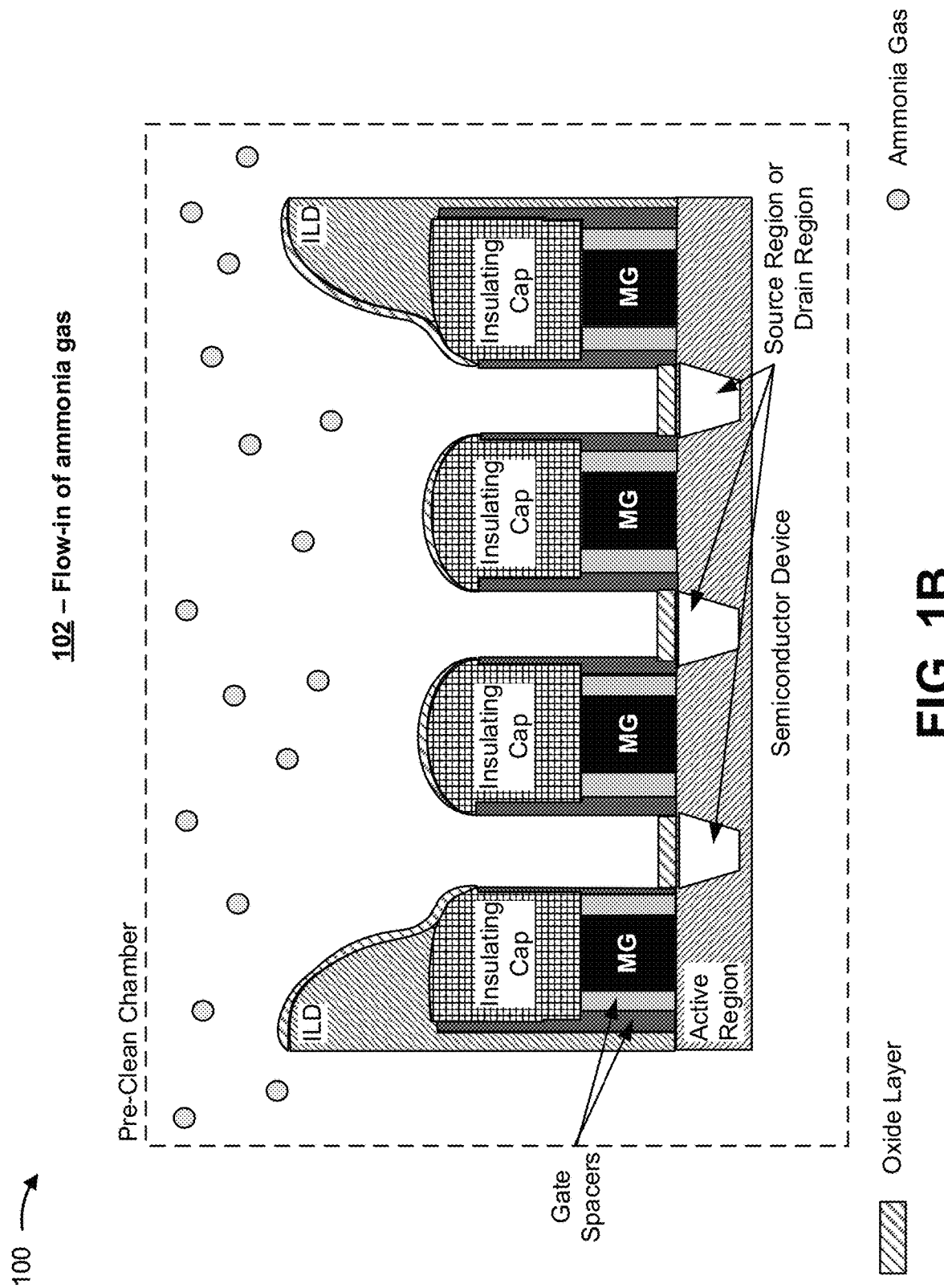

As shown in FIG. 1B, the semiconductor device may be placed in a pre-clean chamber so that a pre-clean process can be performed to etch, clean, or otherwise remove the oxide layer from the semiconductor device. The pre-clean chamber may be part of a pre-clean tool, such as a Collins pre-clean tool, a silicon cobalt nickel (SiCoNi) pre-clean chamber, or another type of pre-clean chamber. In some implementations, the pre-clean chamber may be part of another semiconductor processing tool such that the semiconductor device can remain in the pre-clean chamber for the next semiconductor processing step, which prevents additional oxide formation that otherwise might occur during transport of the semiconductor from the pre-clean chamber to another chamber.

Figure 1C:
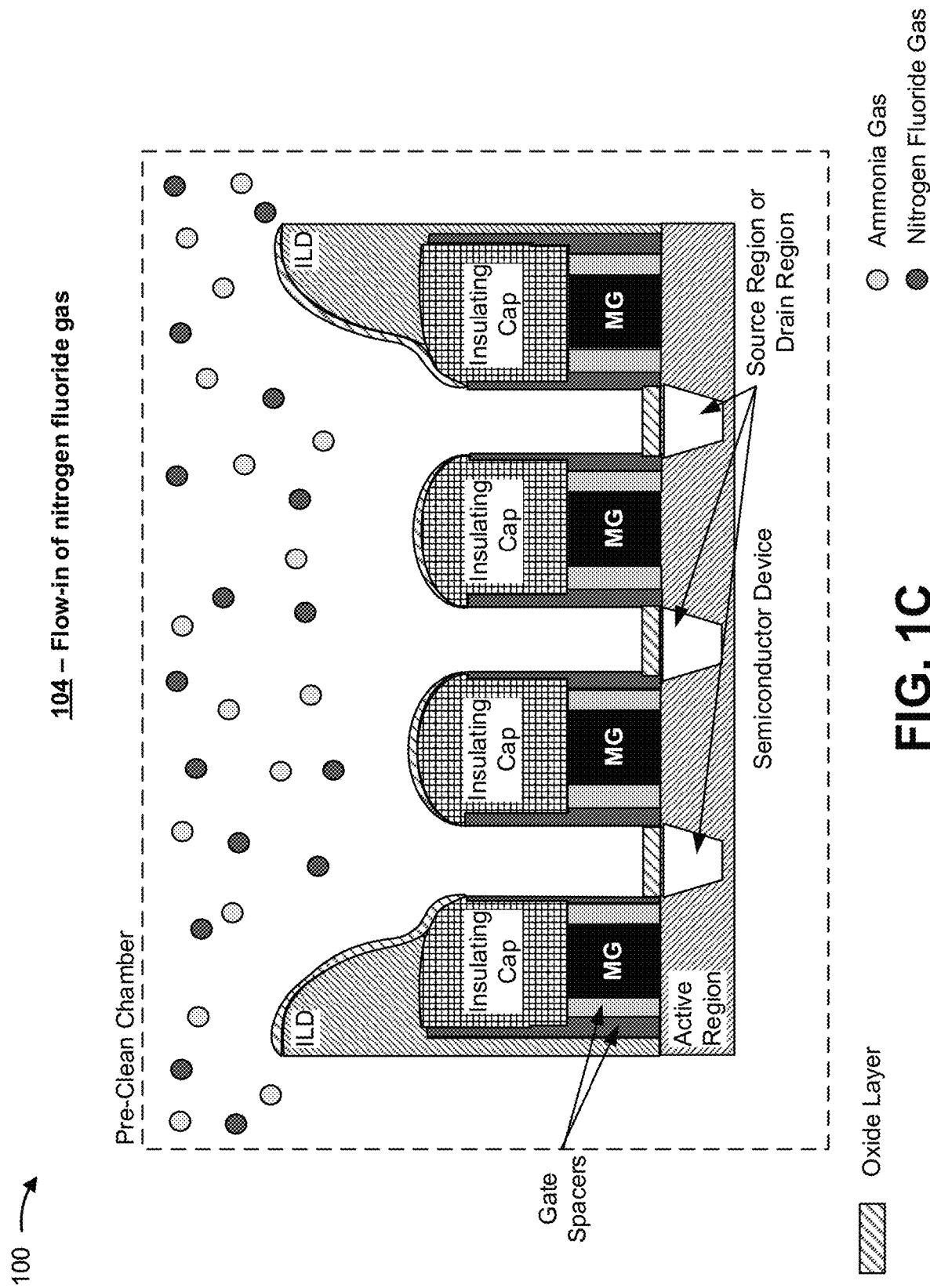

As further shown in FIG. 1B, and by reference number 102, a flow-in of ammonia ($NH_3$) gas may be provided into the pre-clean chamber. Once the flow-in is complete, the pressure may be stabilized in the pre-clean chamber. As shown in FIG. 1C, and by reference number 104, a flow-in of a nitrogen fluoride gas (e.g., nitrogen trifluoride ($NF_3$) gas) may be provided into the pre-clean chamber. The amount of ammonia gas and the amount of nitrogen fluoride gas provided into the pre-clean chamber are such that the ammonia gas/nitrogen fluoride gas mixture in the pre-clean chamber satisfies a particular ratio range or particular ratio threshold. For example, the amount of ammonia gas may be increased relative to a traditional amount of ammonia gas used for the pre-clean process such that the ammonia gas/nitrogen fluoride gas mixture in the pre-clean chamber includes more than 15% and up to 20% nitrogen fluoride gas (e.g., such that the ratio between nitrogen fluoride gas and the ammonia gas in the pre-clean chamber is between 3:17 and 1:5) to promote a sufficient rate of ammonium fluoride ($NH_4F$) gas formation for protection of the interlayer dielectric layer(s), the insulating cap(s), and/or the source/drain region(s) against fluorine etching.

As another example, the amount of ammonia gas and the amount of nitrogen fluoride gas may be provided into the pre-clean chamber such that a fluorine gas is formed in the pre-clean chamber at a sufficient rate to etch the oxide layer while the ammonium fluoride gas is formed in the pre-clean chamber at a sufficient rate to form a protection layer to protect the interlayer dielectric layer(s), the insulating cap(s), and/or the source/drain region(s) from being etched by the fluorine gas. In other words, the amount of ammonia gas and the amount of nitrogen fluoride gas provided into the pre-clean chamber are such that etching or loss of the interlayer dielectric layer(s), the insulating cap(s), and/or the source/drain region(s) due to the fluorine gas and plasma energy in the pre-clean chamber is reduced or prevented.

Figure 1D:
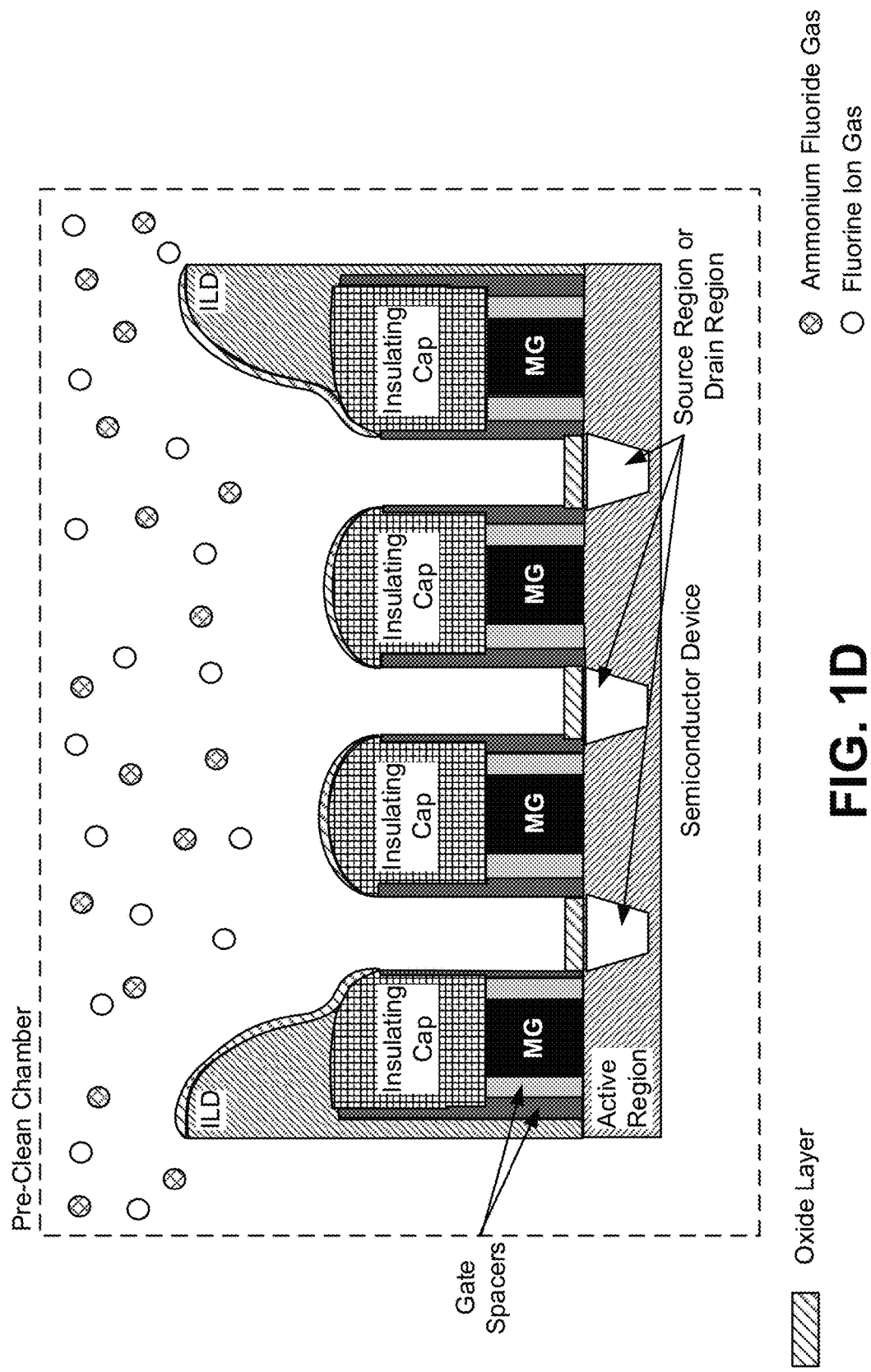

As shown in FIG. 1D, and by reference number 106, a plasma source may be used to cause a reaction between the ammonia gas and the nitrogen fluoride gas in the pre-clean chamber. The plasma source may include an inductively coupled plasma (ICP) source, a transformer coupled plasma (TCP) source, or another type of plasma source capable of generating a plasma. The plasma source may ignite the plasma, which may cause the reaction between the ammonia gas and the nitrogen fluoride gas in the pre-clean chamber. In some implementations, the plasma source may ignite the plasma such that the plasma source causes the reaction between the ammonia gas and the nitrogen fluoride gas during flow-in of the nitrogen fluoride gas into the pre-clean chamber.

As further shown in FIG. 1D, the reaction between the ammonia gas and the nitrogen fluoride gas causes the formation of an ammonium fluoride gas and a fluorine ion gas in the plasma in the pre-clean chamber. In some implementations, the reaction between the ammonia gas and the nitrogen fluoride gas causes formation of a hydrogen fluoride (HF) gas in the pre-clean chamber. For example, the reaction between the ammonia gas and the nitrogen fluoride gas may be represented as:

$$NF_3 + NH_3 \rightarrow \alpha NH_4F + \beta HF$$

where $\alpha$ is greater than $\beta$.

As shown by reference number 108, the ammonium fluoride gas may solidify and form a protection layer during the etch process. The protection layer may be formed at or near the beginning of the pre-clean process, and may be composed of all or primarily ammonium fluoride on and/or over the interlayer dielectric layer(s), the insulating cap(s), and/or the source/drain region(s). The protection layer may solidify into a salt or another form of solid that is deposited onto exposed portions (e.g., top surfaces, side walls, portions thereof, entire surfaces thereof, and/or the like) of the interlayer dielectric layer(s), the insulating cap(s), and/or the source/drain region(s).

The ammonium fluoride gas may be deposited until the protection layer is sufficiently thick to cover (or substantially cover) the portions of the interlayer dielectric layer(s), the insulating cap(s), and/or the source/drain region(s). The thickness of the protection layer may be uniform or variable. In some implementations, the protection layer is formed on the interlayer dielectric layer(s) and the insulating cap(s) to greater than 14 nm thickness. In some implementations, the protection layer is formed to greater than 3 nm thickness on the source/drain region(s).

The protection layer protects the interlayer dielectric layer(s), the insulating cap(s), and/or the source/drain region(s) from being etched by fluorine ions during the pre-clean process. For example, the protection layer reduces or prevents fluorine ions or hydrogen fluoride gas from reaching the interlayer dielectric layer(s), the insulating cap(s), and/or the source/drain region(s) and removing material from the insulating cap(s), the interlayer dielectric layer(s), and/or the source/drain region(s). As another example, the protection layer reduces or eliminates the plasma energy transferred to the insulating cap(s), the interlayer dielectric layer(s), and/or the source/drain region(s) from the plasma supplied to the pre-clean chamber. This reduces the amount of and/or prevents material loss from the interlayer dielectric layer(s), the insulating cap(s), and/or the source/drain region(s) during the pre-clean process.

Figure 1E:
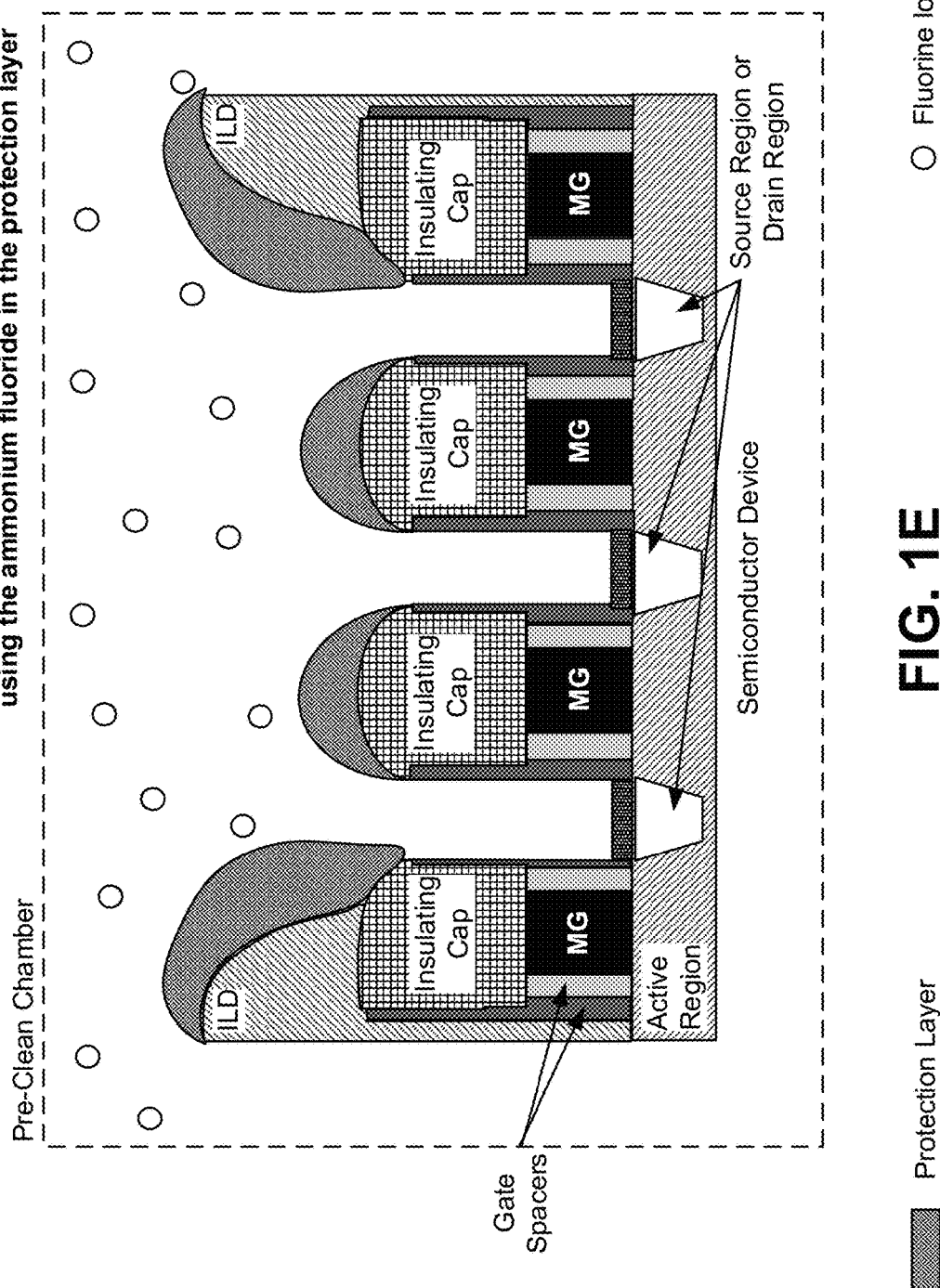

As further shown in FIG. 1E, and by reference number 110, the pre-clean process includes cleaning the insulating cap(s), the interlayer dielectric layer(s), and/or the source/drain region(s). In particular, the ammonium fluoride in the protection layer may react with the oxide layer on the insulating cap(s), the interlayer dielectric layer(s), and/or the source/drain region(s) to clean, etch, or otherwise remove the oxide layer from the insulating cap(s), the interlayer dielectric layer(s), and/or the source/drain region(s). In some implementations, the amount of isotropic plasma provided to the pre-clean chamber may be increased to increase production of ammonium fluoride gas in the pre-clean chamber to increase etching/cleaning of the oxide layer. In this way, the protection layer protects the insulating cap(s), the interlayer dielectric layer(s), and/or the source/drain region(s) while cleaning the oxide layer from the insulating cap(s), the interlayer dielectric layer(s), and/or the source/drain region(s).

The chemical reaction between the ammonium fluoride in the protection layer and the oxide layer may result in the formation of a fluorosilicic acid salt such as ammonium fluorosilicate (($NH_4$)$_2$[$SiF_6$]) in the protection layer. Accordingly, the protection layer may transition to being composed of ammonium fluorosilicate or a combination of ammonium fluorosilicate and ammonium fluoride as the ammonium fluoride in the protection cleans the oxide layer from the insulating cap(s), the interlayer dielectric layer(s), and/or the source/drain region(s). The chemical reaction between the ammonium fluoride in the protection layer and the oxide layer is represented as:

$$NH_4F + SiO_2 \rightarrow (NH_4)_2SiF_6 + H_2O$$

Figure 1F:
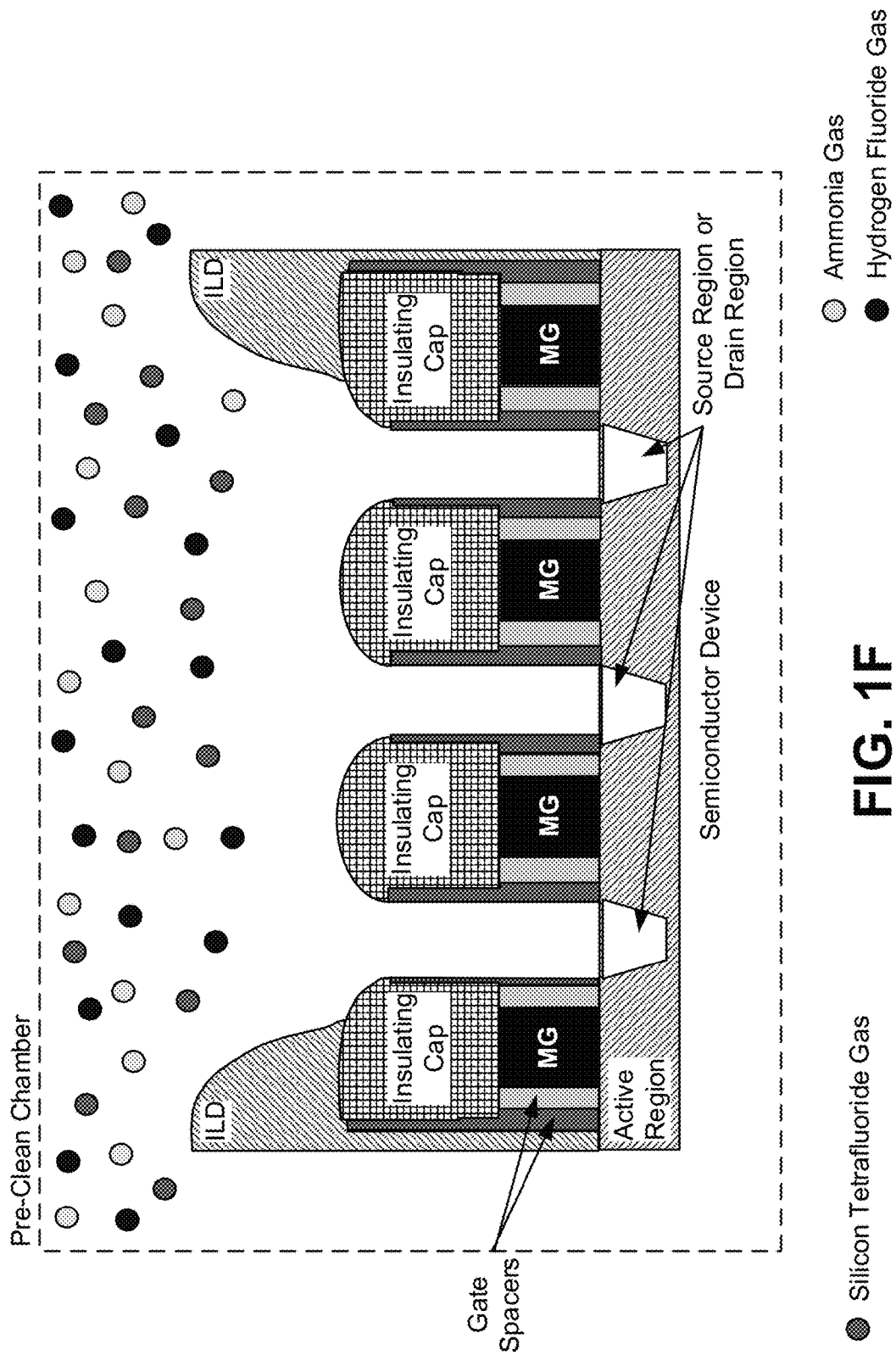

As shown in FIG. 1F, and by reference number 112, the internal temperature of the pre-clean chamber may be elevated such that the semiconductor device is heated. The semiconductor device may be heated after completion of the pre-clean process or as part of the pre-clean process. The semiconductor device may be heated to decompose the protection layer, which removes the protection layer from the semiconductor device (e.g., from the interlayer dielectric layer(s), the insulating cap(s), and/or the source/drain region(s)). The protection layer may be decomposed by heating the semiconductor to a temperature at or above a particular temperature at which ammonium fluoride and/or ammonium fluorosilicate decompose (e.g., 90 degrees Celsius or above), which causes the ammonium fluoride and the ammonium fluorosilicate to transition from a solid or salt to a gas. In particular, heating the protection layer to the point of decomposition of the ammonium fluoride in the protection layer may cause a reaction that is represented as:

$$NH_4F \rightarrow NH_3 + HF$$

where the solid ammonium fluoride decomposes into an ammonia ($NH_3$) gas and a hydrogen fluoride (HF) gas. Heating the protection layer to the point of decomposition of the ammonium fluorosilicate in the protection layer may cause a reaction that is represented as:

$$(NH_4)_2SiF_6 \rightarrow SiF_4 + HF + NH_3$$

where the solid ammonium fluorosilicate decomposes into one or more gasses, including silicon tetrafluoride ($SiF_4$) gas, hydrogen fluoride (HF) gas, and ammonia ($NH_3$) gas.

Figure 1G:
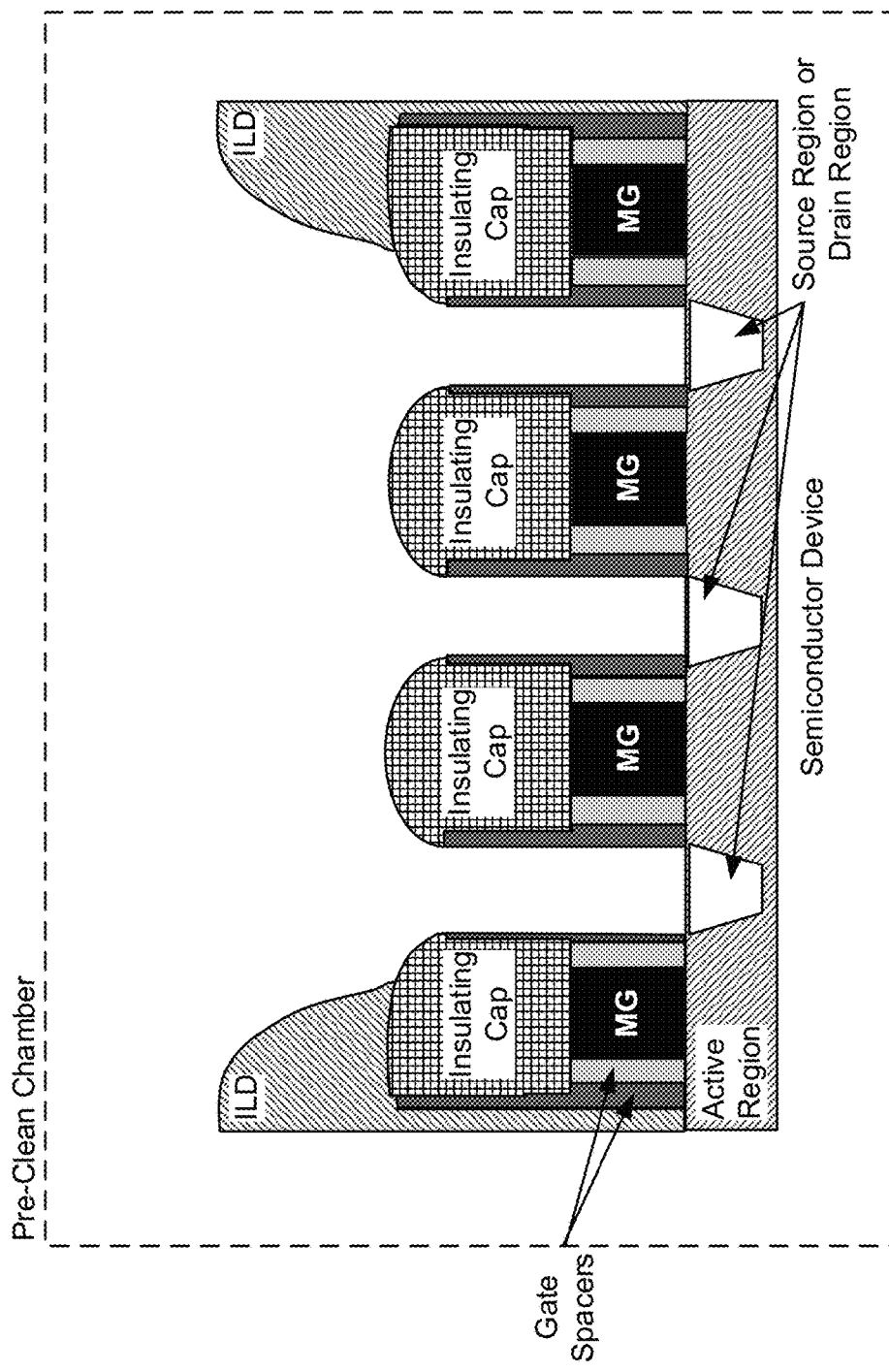

As shown in FIG. 1G, and by reference number 114, the various gasses from the decomposition of the protection layer (e.g., the ammonia gas, the hydrogen fluoride gas, and/or the silicon tetrafluoride gas) may be removed from the pre-clean chamber. The gasses may be removed from the pre-clean chamber using a vacuum or another technique.

Figure 1H:
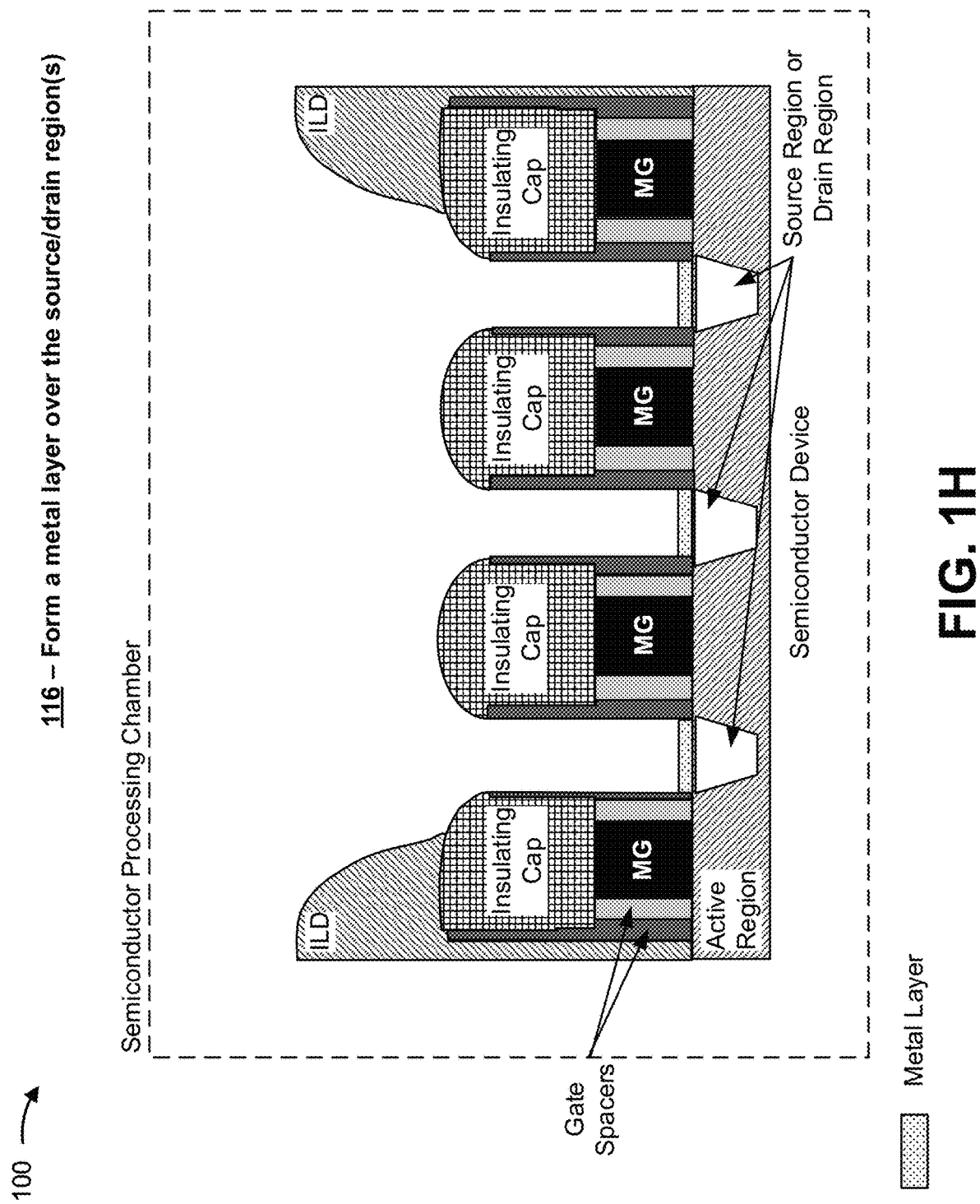

As shown in FIG. 1H, the semiconductor device may be placed in a semiconductor processing chamber such as a deposition chamber, a plating chamber, or another type of semiconductor processing chamber such that metal silicide layer(s) may be formed in and/or over the source/drain region(s). The semiconductor processing chamber may be the same chamber as the pre-clean chamber or may be a different chamber. As shown by reference number 116, a metal layer may be formed over the source/drain region(s).

The metal layer may be formed over the source/drain region(s) by a deposition process (e.g., a chemical vapor deposition process, a physical vapor deposition process, and/or the like), a plating process (e.g., an electroplating process and/or the like), or another type of semiconductor process by which a metal layer can be formed over the source/drain region(s). The metal layer may include a metallic material, such as titanium (Ti), nickel (Ni), or another type of metal.

Figure 1I:
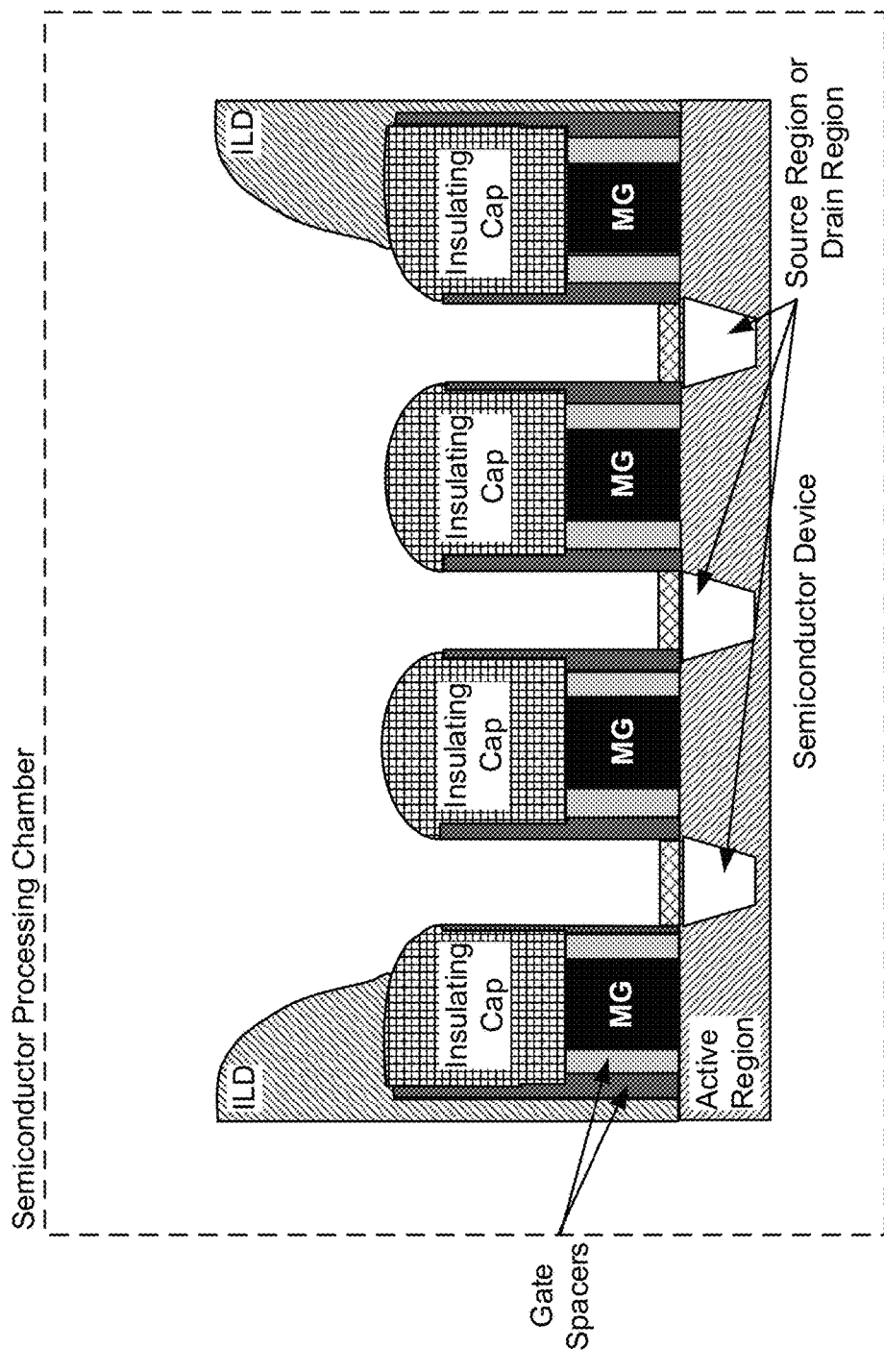

As shown in FIG. 1I, and by reference number 118, an anneal (e.g., a rapid thermal anneal (RTA) or another type of annealing process) may be performed such that the semiconductor is heated. The elevated temperature causes the metal layer to react with the source/drain region(s). The reaction causes the metal layer and silicon in the source/drain region(s) to form a metal silicide layer in and/or on the source/drain region(s). The metal silicide layer may include a metal silicide, such as a titanium silicide (TiSi$_x$), a nickel silicide (Ni$_x$Si), or another metal silicide, that is to reduce contact resistance between the source/drain region(s) and SAC contact(s) that are to be formed over the source/drain region(s).

Figure 1J:
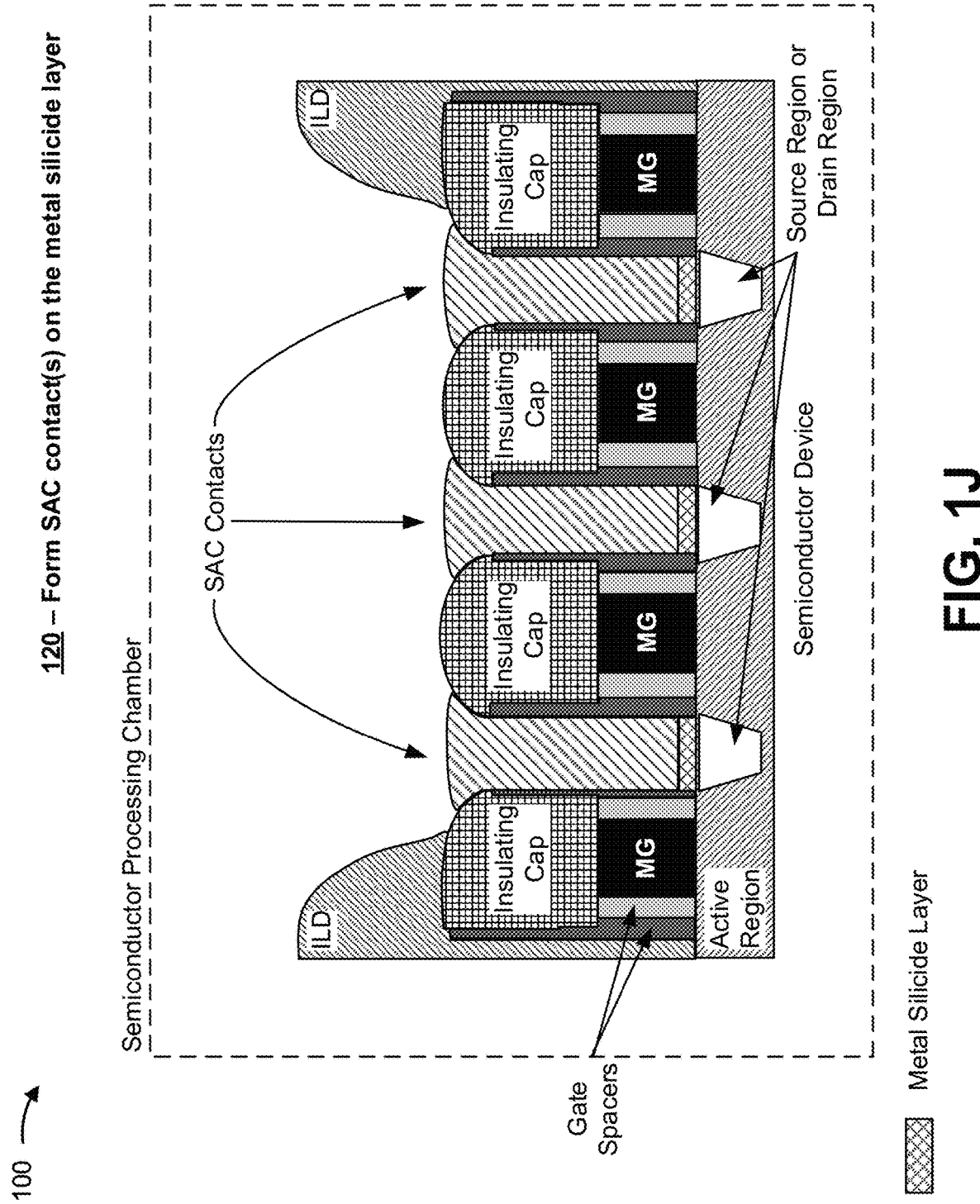

As shown in FIG. 1J, and by reference number 120, SAC contact(s) may be formed on and/or over the metal layer and over the source/drain region(s). The SAC contact(s) may electrically connect the source/drain region(s) to a metal layer of the semiconductor device that is to be formed over SAC contact(s). The SAC contact(s) may be formed of a conductive material, such as copper (Cu), gold (Au), silver (Ag), tungsten (W), and/or the like. As further shown in FIG. 1J, the SAC contact(s) may be formed at least partially over the insulating cap(s). The insulating cap(s) electrically isolate the SAC contact(s) and the metal gate(s) while permitting the SAC contact(s) to be positioned closer to the metal gate(s), which increases the density of the semiconductor device.

The number and arrangement of structures, layers, and/or the like shown in FIGS. 1A-1J are provided as an example. In practice, a semiconductor device including additional structures and/or layers, fewer structures and/or layers, different structures and/or layers, or differently arranged structures and/or layers than those shown in FIGS. 1A-1J may be processed according to the techniques described above in connection with FIGS. 1A-1J.

Figure 2:
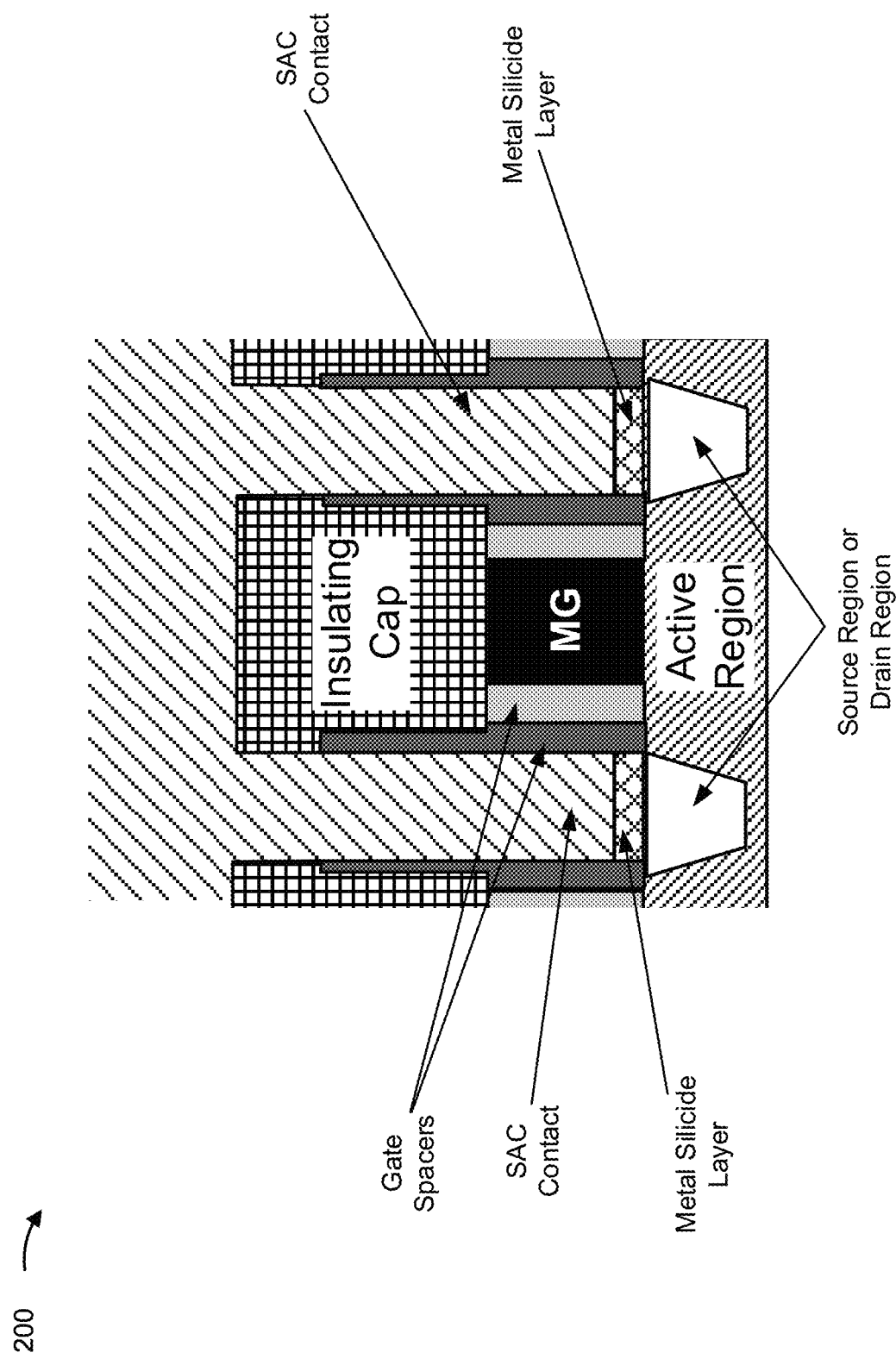
FIG. 2 is an illustration of an example semiconductor structure formed based on the example techniques described in connection with FIGS. 1A-1J.

FIG. 2 is an illustration of an example portion of a semiconductor device 200 formed based on the example techniques described in connection with FIGS. 1A-1J. As shown in FIG. 2, semiconductor device 200 may include an insulating cap formed on a metal gate (MG), a plurality of source regions or drain regions (source/drain regions), a metal silicide layer formed on the source/drain regions, a plurality of SAC contacts formed above the source/drain regions and on the insulating caps, and a plurality of gate spacers. The insulating cap and the gate spacers electrically insulate the metal gate from the SAC contacts. As further shown in FIG. 2, the use of a protection layer during a pre-cleaning process prior to forming the metal silicide layers results in reduced and/or minimal loss loading (e.g., reduced and/or minimal loss of material) for the insulating cap and the source/drain regions.

As indicated above, FIG. 2 is provided as an example. Other examples may differ from what is described with regard to FIG. 2.

Figure 3:
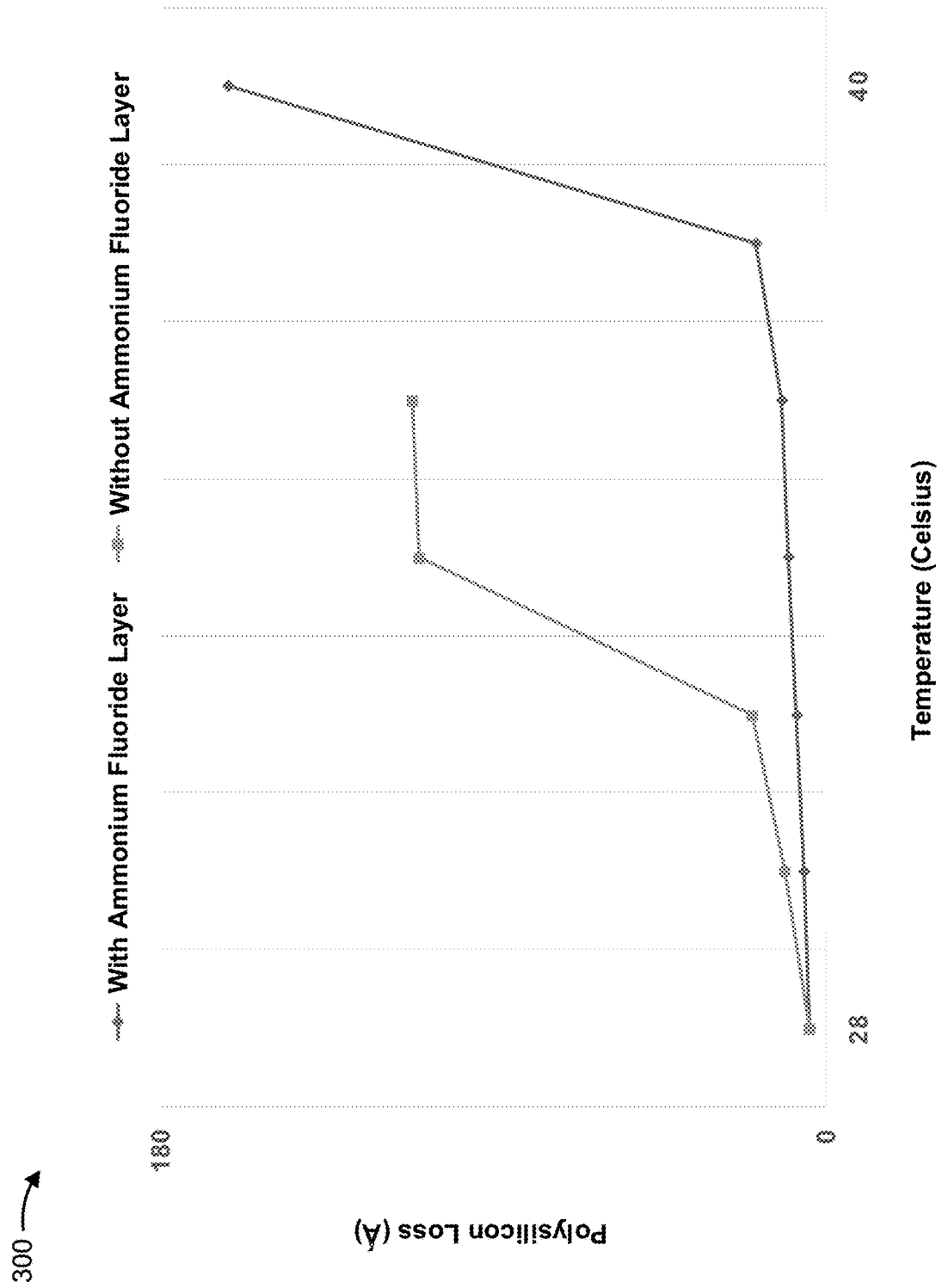
FIG. 3 is an example diagram of epitaxial window data associated with one or more semiconductor structures described herein.

FIG. 3 is an example diagram 300 of epitaxial window data associated with one or more semiconductor structures described herein. As shown in FIG. 3, the amount of polysilicon material loss (illustrated in diagram 300 in angstroms (Å)) from an epitaxial source region or drain region (source/drain region) may increase as the temperature (illustrated in diagram 300 in degrees Celsius) in a pre-clean chamber increases. Without the use of a protection layer during a pre-clean process, as described above in connection with FIGS. 1A-1J, the epitaxial window for a source/drain region extends to about 31 degrees Celsius, at which point, the amount of polysilicon loss for the source/drain region significantly increases. However, the use of a protection layer during a pre-clean process, as described above in connection with FIGS. 1A-1J, extends or increases the epitaxial window for a source/drain region up to about 35 degrees Celsius. Accordingly, the use of a protection layer during a pre-clean process increases the epitaxial window for a source/drain region, which allows for temperature fluctuations in the pre-clean chamber and relaxes temperature control requirements.

As indicated above, FIG. 3 is provided as an example. Other examples may differ from what is described with regard to FIG. 3.

Figure 4:
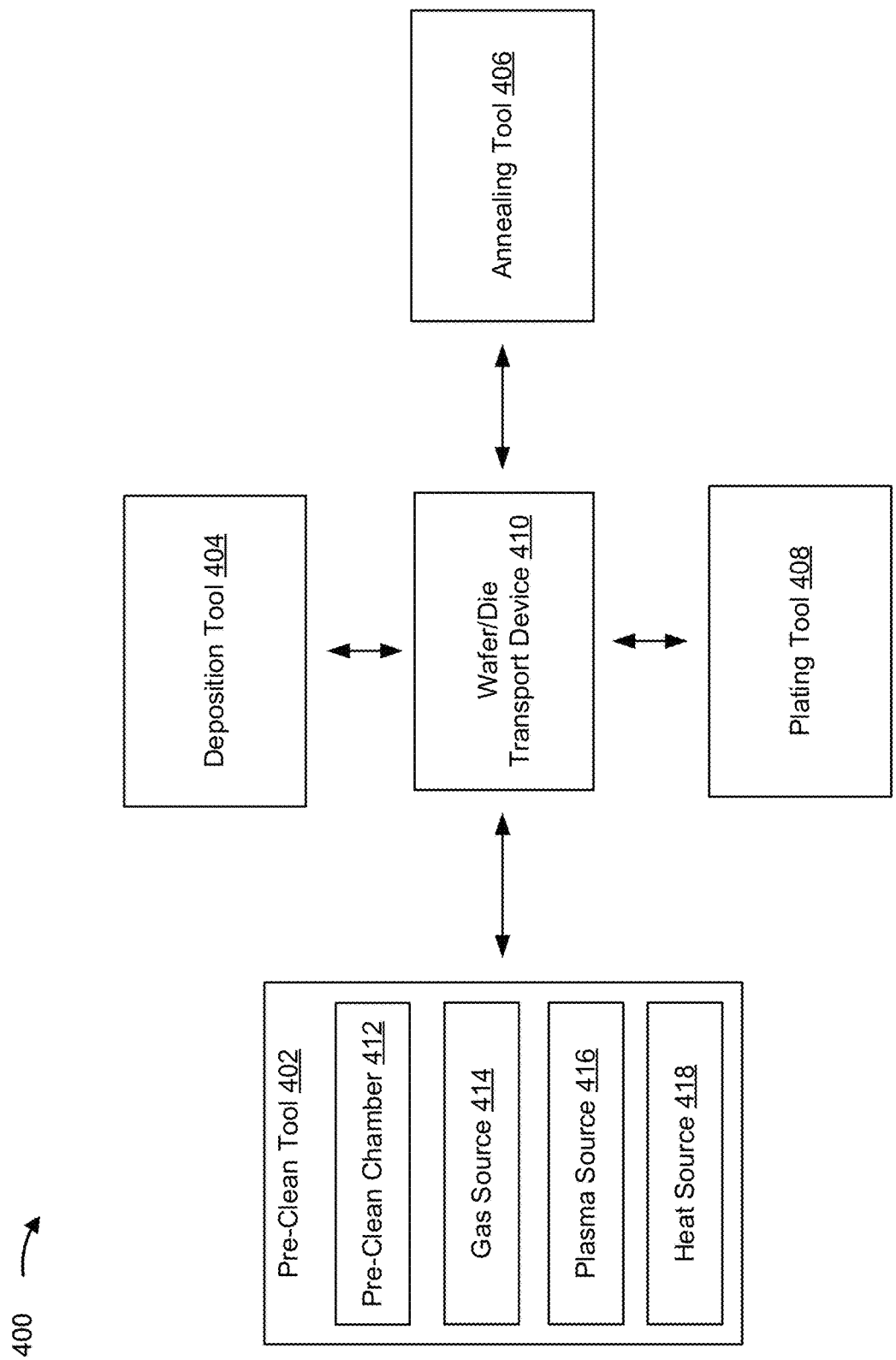
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include a pre-clean tool 402, a deposition tool 404, an annealing tool 406, a plating tool 408, and a wafer/die transport device 410. The tools and/or devices included in example environment 400 may be included in a semiconductor clean room, a semiconductor foundry, a semiconductor processing and/or manufacturing facility, and/or the like.

Pre-clean tool 402 includes a pre-clean chamber 412 and one or more devices capable of performing a pre-clean process on a semiconductor device to remove an oxide layer from the semiconductor device. The one or more devices may include a gas source 414, a plasma source 416, a heat source 418, and/or the like. The gas source 414 may supply various gasses to pre-clean chamber 412, such as an ammonia gas, a nitrogen trifluoride gas, and/or the like. Plasma source 416 may generate a plasma that causes a reaction between the gasses supplied to pre-clean chamber 412. For example, plasma source 416 includes an ICP plasma source, a TCP plasma source, or another type of plasma source capable of causing a reaction between an ammonia gas and a nitrogen trifluoride gas to cause the formation of an ammonium fluoride gas. Heat source 418 may be capable of heating a semiconductor device in pre-clean chamber 412 to cause one or more layers on the semiconductor device to decompose, as described herein. For example, heat source 418 may include a heat lamp, a heating coil, or another type of heating device that heats the semiconductor device to cause an protection layer on the semiconductor device to decompose into an ammonia gas and a hydrogen fluoride gas, as described herein.

Deposition tool 404 is a semiconductor processing tool that includes a semiconductor processing chamber and one or more devices capable of depositing various types of materials onto a semiconductor device. For example, deposition tool 404 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), and/or the like. In some implementations, deposition tool 404 may deposit a metal layer onto a source region or a drain region of a semiconductor device, may deposit a contact material to form a contact (e.g., an SAC contact) of a semiconductor device, and/or the like as described herein.

Annealing tool 406 is a semiconductor processing tool that includes a semiconductor processing chamber and one or more devices capable of heating a semiconductor device. For example, annealing tool 406 may include an RTA tool or another type of annealing tool that is capable of heating a semiconductor device to cause a reaction between two or more materials or gasses, to cause a material to decompose, and/or the like. For example, annealing tool 406 may heat a semiconductor device to cause a metal layer on an epitaxial region (e.g., a source region or a drain region) to react and form a metal silicide layer, as described herein.

Plating tool 408 is a semiconductor processing tool that includes a semiconductor processing chamber and one or more devices capable of plating a semiconductor device with one or more metals. Plating, and particularly electroplating, is a process by which metal structures are formed on a substrate (e.g., a semiconductor wafer, a semiconductor device, and/or the like). Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material ions into trenches, vias, interconnects, contacts, metal layers, and/or other structures in and/or on the substrate.

In some implementations, plating tool 408 may include a copper electroplating tool, an aluminum electroplating tool, a nickel electroplating tool, a titanium electroplating tool, a tin electroplating tool, a compound material or alloy (e.g., tin-silver, tin-lead, and/or the like) electroplating tool, and/or an electroplating tool for one or more other types of conductive materials, metals, and/or the like. In some implementations, plating tool 408 may form a metal layer on a source region or a drain region of a semiconductor device, may form a contact (e.g., an SAC contact) of a semiconductor device, and/or the like as described herein.

Wafer/die transport device 410 includes a mobile robot, a robot arm, a tram or rail car, and/or another type of device that are used to transport wafers and/or dies between semiconductor processing devices 402-408 and/or to and from other locations, such as a wafer rack, a storage room, and/or the like. In some implementations, wafer/die transport device 410 may be a programmed device to travel a particular path and/or may operate semi-autonomously or autonomously.

The number and arrangement of devices and networks shown in FIG. 4 are provided as one or more examples. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
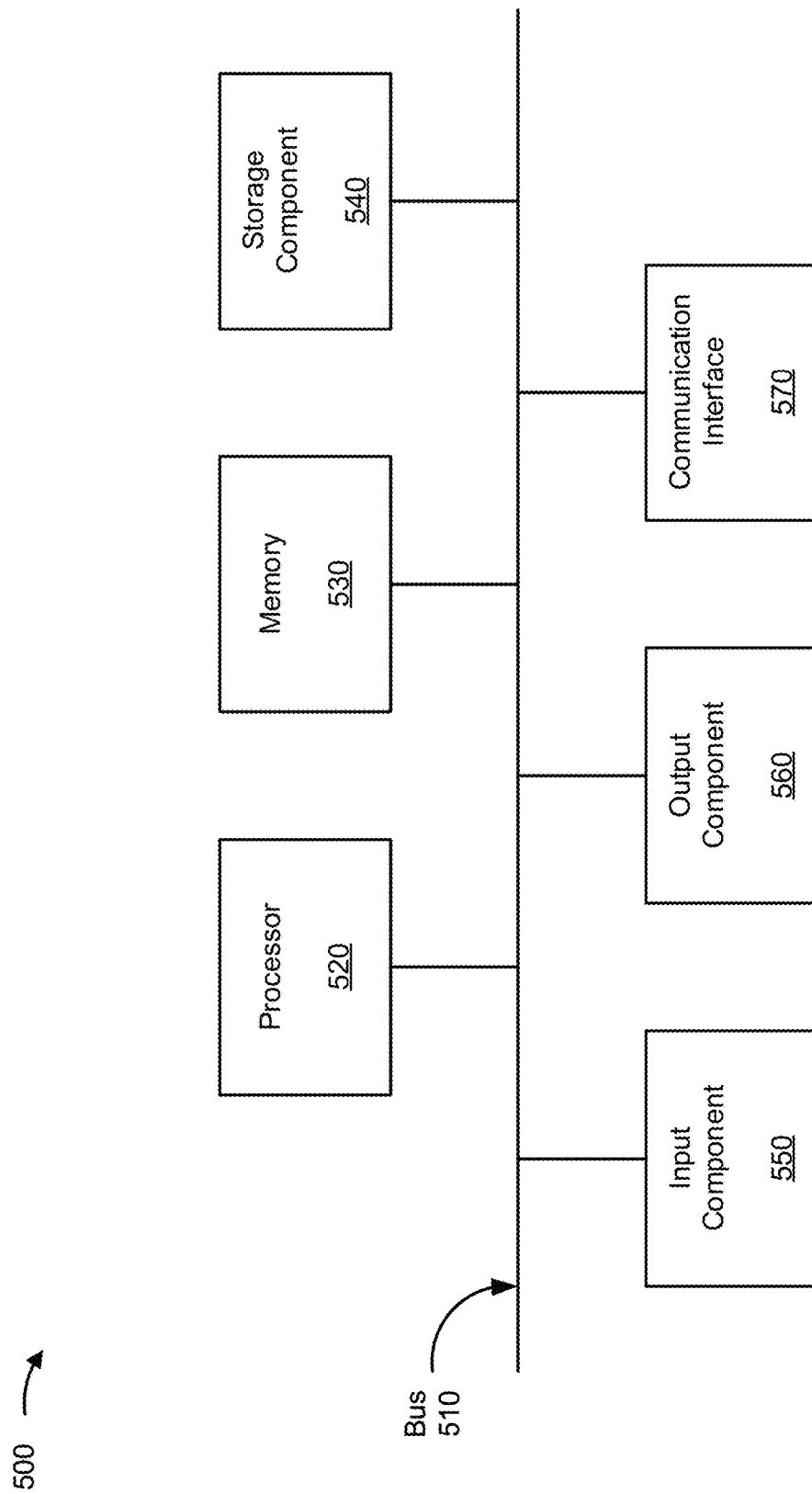
FIG. 5 is a diagram of example components of one or more devices of FIG. 4.

FIG. 5 is a diagram of example components of a device 500. In some implementations, pre-clean tool 402, deposition tool 404, annealing tool 406, plating tool 408, and/or wafer/die transport device 410 may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among multiple components of device 500. Processor 520 is implemented in hardware, firmware, and/or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a component for determining location (e.g., a global positioning system (GPS) component) and/or a sensor (e.g., an accelerometer, a gyroscope, an actuator, another type of positional or environmental sensor, and/or the like). Output component 560 includes a component that provides output information from device 500 (via, e.g., a display, a speaker, a haptic feedback component, an audio or visual indicator, and/or the like).

Communication interface 570 includes a transceiver-like component (e.g., a transceiver, a separate receiver, a separate transmitter, and/or the like) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, a radio frequency (RF) interface, a universal serial bus (USB) interface, a Wi-Fi interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. As used herein, the term "computer-readable medium" refers to a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
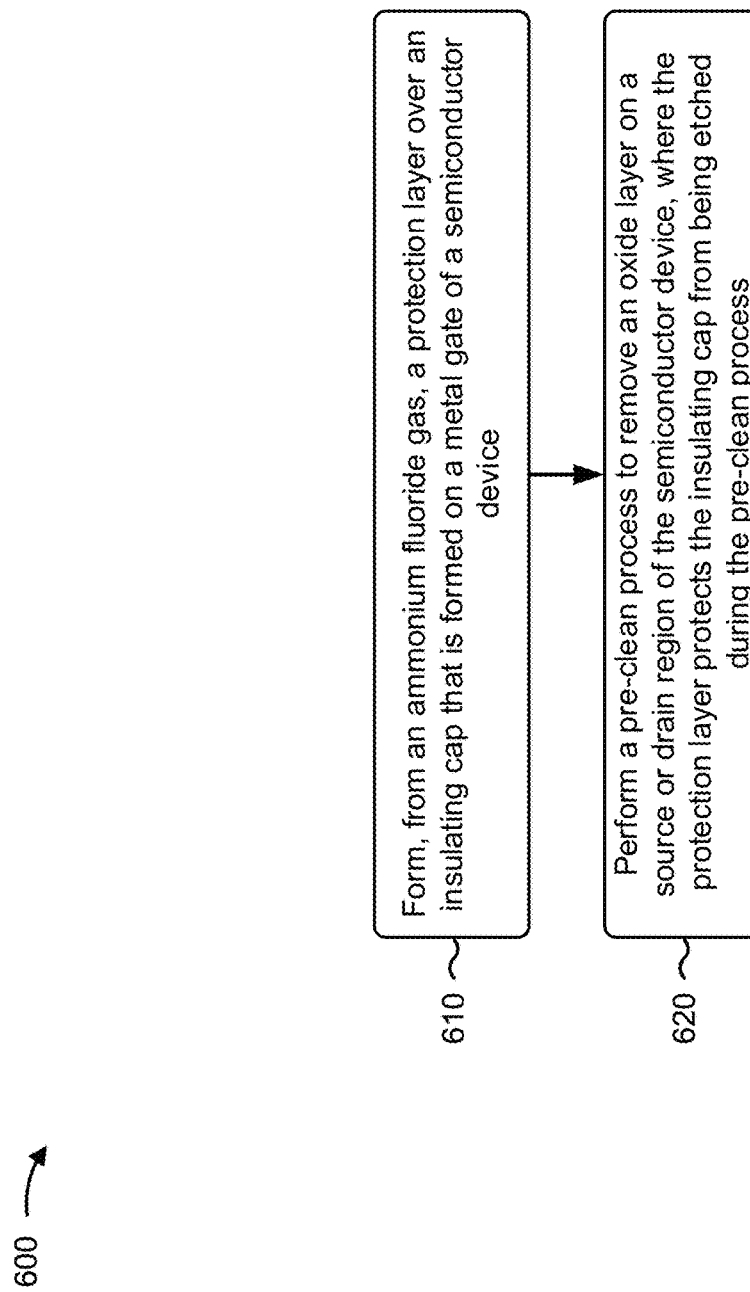
FIGS. 6-8 are flowcharts of example processes for ammonium fluoride pre-clean protection.

FIG. 6 is a flow chart of an example process 600 associated with ammonium fluoride pre-clean protection. In some implementations, one or more process blocks of FIG. 6 may be performed by one or more semiconductor processing tools (e.g., pre-clean tool 402, deposition tool 404, annealing tool 406, plating tool 408, and/or the like). In some implementations, one or more process blocks of FIG. 6 may be performed by one or more components of a device 500, such as processor 520, memory 530, storage component 540, input component 550, output component 560, communication interface 570, and/or the like.

As shown in FIG. 6, process 600 may include forming, from an ammonium fluoride gas, a protection layer over an insulating cap that is formed on a metal gate of a semiconductor device (block 610). For example, the one or more semiconductor processing tools may form, from an ammonium fluoride gas, a protection layer over an insulating cap that is formed on a metal gate of a semiconductor device, as described above.

As further shown in FIG. 6, process 600 may include performing a pre-clean process to remove an oxide layer on a source or drain region of the semiconductor device, where the protection layer protects the insulating cap from being etched during the pre-clean process (block 620). For example, the one or more semiconductor processing tools may perform a pre-clean process to remove an oxide layer on a source or drain region of the semiconductor device, as described above. In some implementations, the protection layer protects the insulating cap from being etched during the pre-clean process.

Process 600 may include additional implementations, such as any single implementation or any combination of implementations described below and/or in connection with one or more other processes described elsewhere herein.

In a first implementation, forming the protection layer includes providing a flow of ammonia gas into a processing chamber; providing a flow of nitrogen fluoride gas into the processing chamber, and causing, using a plasma source, a reaction between the ammonia gas and the nitrogen fluoride gas, the reaction between the ammonia gas and the nitrogen fluoride gas causes formation of an ammonium fluoride gas that deposits over the insulating cap to form the protection layer. In a second implementation, alone or in combination with the first implementation, a ratio between the nitrogen fluoride gas and the ammonia gas is between 3:17 and 1:5.

In a third implementation, alone or in combination with one or more of the first and second implementations, forming the protection layer includes forming the protection layer as part of the pre-clean process. In a fourth implementation, alone or in combination with one or more of the first through third implementations, forming the protection layer includes forming the protection layer such that the protection layer substantially covers a top surface of the insulating cap.

In a fifth implementation, alone or in combination with one or more of the first through fourth implementations, process 600 includes removing the protection layer after performing the pre-clean process. In a sixth implementation, alone or in combination with one or more of the first through fifth implementations, removing the protection layer after performing the pre-clean process includes heating the semiconductor device to cause the protection layer to decompose into one or more gases, and removing the one or more gases from a processing chamber in which the semiconductor device is located.

In a seventh implementation, alone or in combination with one or more of the first through sixth implementations, heating the semiconductor device includes heating the semiconductor device to a temperature equal to or greater than 90 degrees Celsius. In an eighth implementation, alone or in combination with one or more of the first through seventh implementations, process 600 includes removing the protection layer; and forming a metal silicide layer for the source or drain region after removing the protection layer. In a ninth implementation, alone or in combination with one or more of the first through eighth implementations, process 600 includes forming a contact for the source or drain region, where the metal silicide layer is reducing contact resistance between the source or drain region and the contact.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
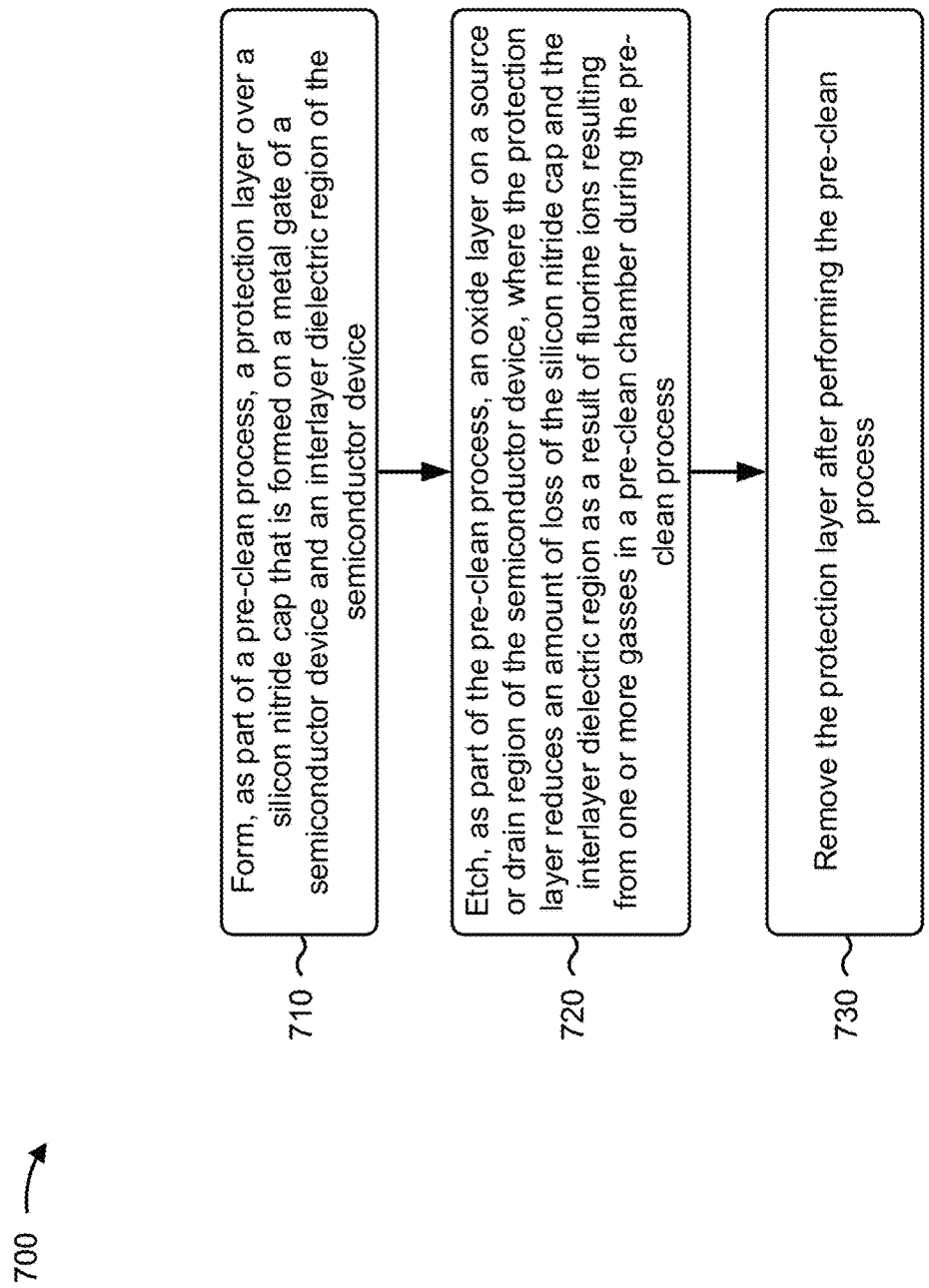

FIG. 7 is a flow chart of an example process 700 associated with ammonium fluoride pre-clean protection. In some implementations, one or more process blocks of FIG. 7 may be performed by one or more semiconductor processing tools (e.g., pre-clean tool 402, deposition tool 404, annealing tool 406, plating tool 408, and/or the like). In some implementations, one or more process blocks of FIG. 7 may be performed by one or more components of a device 500, such as processor 520, memory 530, storage component 540, input component 550, output component 560, communication interface 570, and/or the like.

As shown in FIG. 7, process 700 may include forming, as part of a pre-clean process, a protection layer over a silicon nitride cap that is formed on a metal gate of a semiconductor device and an interlayer dielectric region of the semiconductor device (block 710). For example, the one or more semiconductor processing tools may form, as part of a pre-clean process, a protection-layer over the silicon nitride cap, as described above.

As further shown in FIG. 7, process 700 may include etching, as part of the pre-clean process, an oxide layer on a source or drain region of the semiconductor device, where the protection layer reduces an amount of loss of the silicon nitride cap and the interlayer dielectric region as a result of fluorine ions resulting from one or more gasses used during the etching (block 720). For example, the one or more semiconductor processing tools may etch, as part of the pre-clean process, an oxide layer on a source or drain region of the semiconductor device, as described above. In some implementations, the protection layer reduces an amount of loss of the silicon nitride cap and the interlayer dielectric region as a result of fluorine ions resulting from one or more gasses a pre-clean chamber during the pre-clean process.

As further shown in FIG. 7, process 700 may include removing the protection layer after performing the pre-clean process (block 730). For example, the one or more semiconductor processing tools may remove the protection layer after performing the pre-clean process, as described above.

Process 700 may include additional implementations, such as any single implementation or any combination of implementations described below and/or in connection with one or more other processes described elsewhere herein.

In a first implementation, process 700 includes forming, after removing the protection layer, a contact for the source or drain region, where the contact is being a self-aligned contact that is formed at least partially over the silicon nitride cap and the metal gate. In a second implementation, alone or in combination with the first implementation, the protection layer increases a polysilicon temperature range for the pre-clean process.

In a third implementation, alone or in combination with one or more of the first and second implementations, the one or more gasses include an ammonia gas, and a nitrogen trifluoride gas, and forming the protection layer includes increasing a ratio of the nitrogen trifluoride gas to the ammonia gas, increasing the ratio of the nitrogen trifluoride gas to the ammonia gas causes an increased rate of formation of the ammonium fluoride gas in the pre-clean chamber, and wherein the ammonium fluoride gas deposits onto the silicon nitride cap and the interlayer dielectric layer to form the protection region r. In a fourth implementation, alone or in combination with one or more of the first through third implementations, removing the protection layer after performing the pre-clean process includes heating the semiconductor device to cause the protection layer to decompose into an ammonia gas and a hydrogen fluoride gas, and removing the ammonia gas and the hydrogen fluoride gas from a processing chamber in which the semiconductor device is located.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
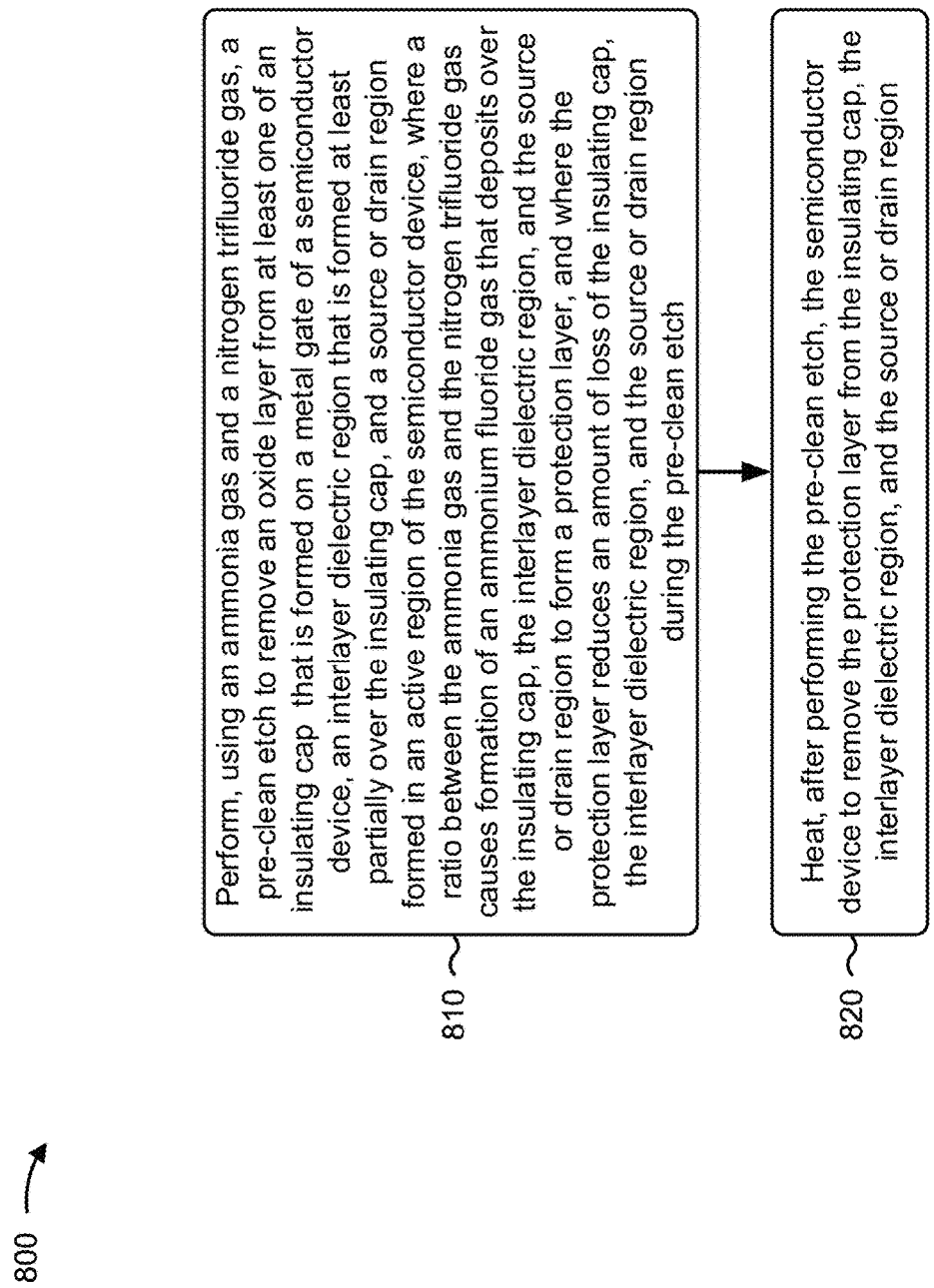

FIG. 8 is a flow chart of an example process 800 associated with ammonium fluoride pre-clean protection. In some implementations, one or more process blocks of FIG. 8 may be performed by one or more semiconductor processing tools (e.g., pre-clean tool 402, deposition tool 404, annealing tool 406, plating tool 408, and/or the like). In some implementations, one or more process blocks of FIG. 8 may be performed by one or more components of a device 500, such as processor 520, memory 530, storage component 540, input component 550, output component 560, communication interface 570, and/or the like.

As shown in FIG. 8, process 800 may include performing, using an ammonia gas and a nitrogen trifluoride gas, a pre-clean etch to remove an oxide layer from at least one of an insulating cap that is formed on a metal gate of a semiconductor device, an interlayer dielectric region that is formed at least partially over the insulating cap, and a source or drain region formed in an active region of the semiconductor device, where a ratio between the ammonia gas and the nitrogen trifluoride gas causes formation of an ammonium fluoride that deposits over the insulating cap, the interlayer dielectric region, and the source or drain region, to form a protection layer and where the protection layer reduces an amount of loss of the insulating cap, the interlayer dielectric region, and the source or drain region during the pre-clean etch (block 810). For example, the one or more semiconductor processing tools may perform, using an ammonia gas and a nitrogen trifluoride gas, a pre-clean etch to remove an oxide layer from, as described above. In some implementations, a ratio between the ammonia gas and the nitrogen trifluoride gas causes formation of an ammonium fluoride gas that deposits over the insulating cap, the interlayer dielectric region, and the source or drain region to form a protection layer. In some implementations, the protection layer reduces an amount of loss of the insulating cap, the interlayer dielectric region, and the source or drain region during the pre-clean etch.

As further shown in FIG. 8, process 800 may include heating, after performing the pre-clean etch, the semiconductor device to remove the protection layer from the insulating cap, the interlayer dielectric region, and the source or drain region (block 820). For example, the one or more semiconductor processing tools may heat, after performing the pre-clean etch, the semiconductor device to remove the protection layer from the insulating cap, the interlayer dielectric region, and the source or drain region, as described above.

Process 800 may include additional implementations, such as any single implementation or any combination of implementations described below and/or in connection with one or more other processes described elsewhere herein.

In a first implementation, the source or drain region is an epitaxial region, and the protection layer increases an epitaxial loss window of the epitaxial region. In a second implementation, alone or in combination with the first implementation, heating the semiconductor device includes heating the semiconductor device to a temperature equal to or greater than 90 degrees Celsius. In a third implementation, alone or in combination with one or more of the first and second implementations, process 800 includes forming a titanium silicide layer for the source or drain region after removing the protection layer; and forming a contact for the source or drain region, where the titanium silicide layer is reducing contact resistance between the source or drain region and the contact. In a fourth implementation, alone or in combination with one or more of the first through third implementations, the protection layer covers an entire top surface of the insulating cap, an entire top surface of the interlayer dielectric region, and an entire top surface of the source/drain region.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, an ammonium fluoride gas may be used to form a protection layer for one or more interlayer dielectric layers, one or more insulating caps, and/or one or more source/drain regions of a semiconductor device during a pre-clean etch process. The protection layer can be formed through an oversupply of nitrogen trifluoride during the pre-clean etch process. The oversupply of nitrogen trifluoride may be provided by increasing the flow-in of nitrogen trifluoride relative to a traditional amount of nitrogen trifluoride used during a pre-clean process. The oversupply of nitrogen trifluoride causes an increased formation of ammonium fluoride gas, which coats the interlayer dielectric layer(s), the insulating cap(s), and/or the source/drain region(s) with a thick protection layer. In this way, the protection layer protects the interlayer dielectric layer(s), the insulating cap(s), and/or the source/drain region(s) during the pre-clean process from being etching by fluorine ions formed during the pre-clean process. This may reduce the risk of an MG/MD short, may reduce SAC loss loading for the semiconductor device (e.g., may reduce the amount of insulating layer loss during the pre-clean process), may increase the epitaxial loss window for the semiconductor device (e.g., may increase the temperature window for the pre-clean process, which may protect against temperature drift), and/or the like.

As described in greater detail above, some implementations described herein provide a method. The method includes forming, from an ammonium fluoride gas, a protection layer over an insulating cap that is formed on a metal gate of a semiconductor device. The method includes performing a pre-clean process to remove an oxide layer on a source or drain region of the semiconductor device. The protection layer protects the insulating cap from being etched during the pre-clean process.

As described in greater detail above, some implementations described herein provide a method. The method includes forming, as part of a pre-clean process, a protection layer over a silicon nitride cap that is formed on a metal gate of a semiconductor device, and an interlayer dielectric region of the semiconductor device. The method includes etching, as part of the pre-clean process, an oxide layer a source or drain region of the semiconductor device. The protection layer reduces an amount of loss of the silicon nitride cap and the interlayer dielectric region as a result of fluorine ions resulting from one or more gasses in a pre-clean chamber during the etching. The method includes removing the protection layer after performing the pre-clean process.

As described in greater detail above, some implementations described herein provide a method. The method includes performing, using an ammonia gas and a nitrogen trifluoride gas, a pre-clean etch to remove an oxide layer from at least one of an insulating cap that is formed on a metal gate of a semiconductor device, an interlayer dielectric region that is formed at least partially over the insulating cap, and a source or drain region formed in an active region of the semiconductor device. A ratio between the ammonia gas and the nitrogen trifluoride gas causes formation of a protection layer over the insulating cap, the interlayer dielectric region, and the source or drain region. The protection layer reduces an amount of loss of the insulating cap, the interlayer dielectric region, and the source or drain region during the pre-clean etch. The method includes heating, after performing the pre-clean etch, the semiconductor device to remove the protection layer from the insulating cap, the interlayer dielectric region, and the source or drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, from an ammonium fluoride gas, a protection layer over an insulating cap that is formed on a metal gate of a semiconductor device; and
   performing a pre-clean process to remove an oxide layer on a source or drain region of the semiconductor device,
      wherein the protection layer protects the insulating cap from being etched during the pre-clean process.

2. The method of claim 1, wherein forming the protection layer comprises:
   providing a flow of ammonia gas into a processing chamber;
   providing a flow of nitrogen fluoride gas into the processing chamber; and
   causing, using a plasma source, a reaction between the ammonia gas and the nitrogen fluoride gas,
      wherein the reaction between the ammonia gas and the nitrogen fluoride gas causes formation of the ammonium fluoride gas that deposits over the insulating cap to form the protection layer.

3. The method of claim 2, wherein a ratio between the nitrogen fluoride gas and the ammonia gas is between 3:17 and 1:5.

4. The method of claim 1, wherein forming the protection layer comprises:
   forming the protection layer as part of the pre-clean process.

5. The method of claim 1, wherein forming the protection layer comprises:
   forming the protection layer such that the protection layer substantially covers a top surface of the insulating cap.

6. The method of claim 1, further comprising:
   removing the protection layer after performing the pre-clean process.

7. The method of claim 6, wherein removing the protection layer after
   performing the pre-clean process comprises:
   heating the semiconductor device to cause the protection layer to decompose into one or more gases; and
   removing the one or more gases from a processing chamber in which the semiconductor device is located.

8. The method of claim 7, wherein heating the semiconductor device comprises:
   heating the semiconductor device to a temperature equal to or greater than 90 degrees Celsius.

9. The method of claim 1, further comprising:
   removing the protection layer; and
   forming a metal silicide layer for the source or drain region after removing the protection layer.

10. The method of claim 9, further comprising:
    forming a contact for the source or drain region,
       wherein the metal silicide layer reduces contact resistance between the source or drain region and the contact.

11. A method, comprising:
    forming, as part of a pre-clean process, a protection layer over:
       a silicon nitride cap that is formed on a metal gate of a semiconductor device, and
       an interlayer dielectric region of the semiconductor device;
    etching, as part of the pre-clean process, an oxide layer on a source or drain region of the semiconductor device,
       wherein the protection layer reduces an amount of loss of the silicon nitride cap and the interlayer dielectric region as a result of fluorine ions resulting from one or more gasses in a pre-clean chamber during the pre-clean process; and
    removing the protection layer after performing the pre-clean process.

12. The method of claim 11, further comprising:
forming, after removing the protection layer, a contact for the source or drain region,
wherein the contact is a self-aligned contact that is formed at least partially over the silicon nitride cap and the metal gate.

13. The method of claim 11, wherein the protection layer increases a polysilicon temperature range for the pre-clean process.

14. The method of claim 11, wherein the one or more gasses comprise:
an ammonia gas, and
a nitrogen trifluoride gas; and
wherein forming the protection layer comprises:
increasing a ratio of the nitrogen trifluoride gas to the ammonia gas,
wherein increasing the ratio of the nitrogen trifluoride gas to the ammonia gas causes an increased rate of formation of an ammonium fluoride gas in the pre-clean chamber, and
wherein the ammonium fluoride gas deposits onto the silicon nitride cap and the interlayer dielectric region to form the protection layer.

15. The method of claim 11, wherein removing the protection layer after performing the pre-clean process comprises:
heating the semiconductor device to cause the protection layer to decompose into an ammonia gas and a hydrogen fluoride gas; and
removing the ammonia gas and the hydrogen fluoride gas from a processing chamber in which the semiconductor device is located.

16. A method, comprising:
performing, using an ammonia gas and a nitrogen trifluoride gas, a pre-clean etch to remove an oxide layer from at least one of:
an insulating cap that is formed on a metal gate of a semiconductor device,
an interlayer dielectric region that is formed at least partially over the insulating cap, and
a source or drain region formed in an active region of the semiconductor device,
wherein a ratio between the ammonia gas and the nitrogen trifluoride gas causes formation of a protection layer over the insulating cap, the interlayer dielectric region, and the source or drain region, and
wherein the protection layer reduces an amount of loss of the insulating cap, the interlayer dielectric region, and the source or drain region during the pre-clean etch; and
heating, after performing the pre-clean etch, the semiconductor device to remove the protection layer from the insulating cap, the interlayer dielectric region, and the source or drain region.

17. The method of claim 16, wherein the source or drain region is an epitaxial region; and
wherein the protection layer increases an epitaxial loss window of the epitaxial region.

18. The method of claim 16, wherein heating the semiconductor device comprises:
heating the semiconductor device to a temperature equal to or greater than 90 degrees Celsius.

19. The method of claim 16, further comprising:
forming a titanium silicide layer for the source or drain region after removing the protection layer; and
forming a contact for the source or drain region,
wherein the titanium silicide layer reduces contact resistance between the source or drain region and the contact.

20. The method of claim 16, wherein the protection layer covers an entire top surface of the insulating cap, an entire top surface of the interlayer dielectric region, and an entire top surface of the source or drain region.

* * * * *